(12) United States Patent
Lupo

(10) Patent No.: US 10,438,809 B2
(45) Date of Patent: Oct. 8, 2019

(54) METHOD OF FORMING A SEMICONDUCTOR DEVICE INCLUDING A PITCH MULTIPLICATION

(71) Applicant: Micron Technology, Inc., Boise, ID (US)

(72) Inventor: Lionel Lupo, Hiroshima (JP)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 15/652,768

(22) Filed: Jul. 18, 2017

(65) Prior Publication Data

US 2017/0338121 A1 Nov. 23, 2017
US 2019/0279874 A9 Sep. 12, 2019

Related U.S. Application Data

(63) Continuation of application No. 14/810,711, filed on Jul. 28, 2015, now Pat. No. 9,741,582.

(51) Int. Cl.
*H01L 31/00* (2006.01)
*H01L 21/308* (2006.01)
*H01L 21/00* (2006.01)
*H01L 27/108* (2006.01)

(52) U.S. Cl.
CPC ...... *H01L 21/3086* (2013.01); *H01L 21/3088* (2013.01); *H01L 27/10814* (2013.01); *H01L 27/10876* (2013.01)

(58) Field of Classification Search
None
See application file for complete search history.

(56) References Cited

U.S. PATENT DOCUMENTS

| | | |
|---|---|---|
| 5,932,489 A | 8/1999 | Huang |
| 7,550,391 B2 | 6/2009 | Kyung-Yub et al. |
| 7,816,270 B2 | 10/2010 | Park |
| 8,956,982 B2 | 2/2015 | Tsubata |
| 2002/0014648 A1 | 2/2002 | Mitzutani |
| 2006/0046200 A1 | 3/2006 | Abatchev et al. |
| 2006/0240361 A1 | 10/2006 | Lee |
| 2009/0317748 A1 | 12/2009 | Choi |
| 2010/0086878 A1 | 4/2010 | Hatakeyama |
| 2010/0227281 A1 | 9/2010 | Sills |
| 2011/0159695 A1 | 6/2011 | Sukekawa |
| 2011/0250757 A1 | 10/2011 | Mitsunari et al. |
| 2012/0156876 A1 | 6/2012 | Chen |
| 2012/0241834 A1 | 9/2012 | Nakajima |
| 2014/0220782 A1 | 8/2014 | Seo |
| 2015/0031198 A1 | 1/2015 | Miyoshi |
| 2015/0155198 A1 | 6/2015 | Tsai |
| 2016/0020099 A1 | 1/2016 | Segawa |

FOREIGN PATENT DOCUMENTS

| | | |
|---|---|---|
| JP | 2008-103718 | 5/2008 |
| JP | 2011-233878 | 11/2011 |

*Primary Examiner* — Evren Seven
(74) *Attorney, Agent, or Firm* — Wells St. John P.S.

(57) ABSTRACT

Disclosed herein is a manufacturing method of a semiconductor device that includes forming first and second layers over an underlying martial such that the first layer is between the underlying material and the second layer, forming a third layer over the second layer, forming first and second core portions apart from each other over the third layer, forming a gap portion between the first and the second core portions; and removing the second and the third layers by using the first and the second core portions and the gap portion as a mask to expose a part of the first layer.

13 Claims, 40 Drawing Sheets

METHOD OF FORMING A SEMICONDUCTOR DEVICE INCLUDING A PITCH MULTIPLICATION

RELATED PATENT DATA

This patent resulted from a continuation application of U.S. patent application Ser. No. 14/810,711, filed Jul. 28, 2015, entitled "Method Of Forming A Semiconductor Device Including A Pitch Multiplication", naming Lionel LUPO as inventor, which claims benefit to foreign Japanese application JP 2014-156666, filed on Jul. 31, 2014, entitled "Method Of Forming A Semiconductor Device Including A Pitch Multiplication", naming Lionel LUPO as inventor, the disclosures of which are incorporated by reference.

TECHNICAL FIELD

The present invention relates generally to methods of forming a semiconductor device, in particular, to a method including process steps to form smaller features of below a resolution limit of the exposure tool.

BACKGROUND OF THE INVENTION

A photolithography technique is known as a technique according to which a material formed on a substrate is etched using a photoresist pattern obtained by photomask-utilized light-exposure and development of a photoresist, as a mask. In a quest for improved resolution, a thinner photoresist becomes necessary, which has led to a situation where the thinner photoresist alone cannot offer sufficient etching resistance. To deal with this problem, a technique has come into wide use, according to which a photoresist pattern is transferred to a mask material, such as silicon nitride film that can be processed by the thinner photoresist, and then a work piece formed on a substrate is etched, using this silicon nitride film as a mask, to form a pattern. Such a silicon nitride film is referred to as hard mask.

A demand for microfabrication and high densification of semiconductor memories, etc., has been so intensified in recent years that the pace of an improvement in resolution through development of lithographic techniques including exposure systems and photoresist materials is not fast enough to meet such a demand. Under these circumstances, techniques by which patterns are formed at a pitch smaller than a lithography resolution limit, utilizing a hard mask, has become widely noticed.

According to one of such techniques, a core pattern is formed first, and a spacer is formed on the side walls of the core pattern, and then a hard mask material is buried in recessions between different parts of the spacer to form a gap pattern. Subsequently, the spacer is eliminated selectively to form a pattern between the core pattern and the gap pattern, the formed pattern being identical in width with the spacer, thus having a pitch smaller than the lithography resolution limit. This technique is referred to as SADP (Self-Aligned Double Patterning).

An LELE (Litho-Etch-Litho-Etch) technique is known as a method of forming active areas of island patterns surrounded by isolation regions formed by an STI (Shallow Trench Isolation) method. According to the LELE method, a desired pattern is formed by combining a first pattern created by the first round of lithography and etching with a second pattern created by the second round of lithography and etching. The above SADP technique is adopted to form the first pattern, whose pitch is thus reduced to half by the SADP technique, and a part of the first pattern is cut by the second pattern. Through this process, fine island patterns having a pitch smaller than the resolution limit can be formed.

Japanese Patent Application Laid Open No. 2008-103718, Japanese Patent Application Laid Open No. 2011-233878.

DETAILED DESCRIPTION OF EXAMPLE EMBODIMENTS

Preferred embodiments of the present invention will now be described in detail with reference to the accompanying drawings. In the accompanying drawings, various components used for detailed description of the present invention are depicted in their arbitrarily enlarged or reduced forms, which do not imply the actual or relative size of the depicted components.

A DRAM (Dynamic Random Access Memory), which is a semiconductor device manufactured preferably by a manufacturing method for a semiconductor device of the present invention, will first be described briefly.

Figure 1:
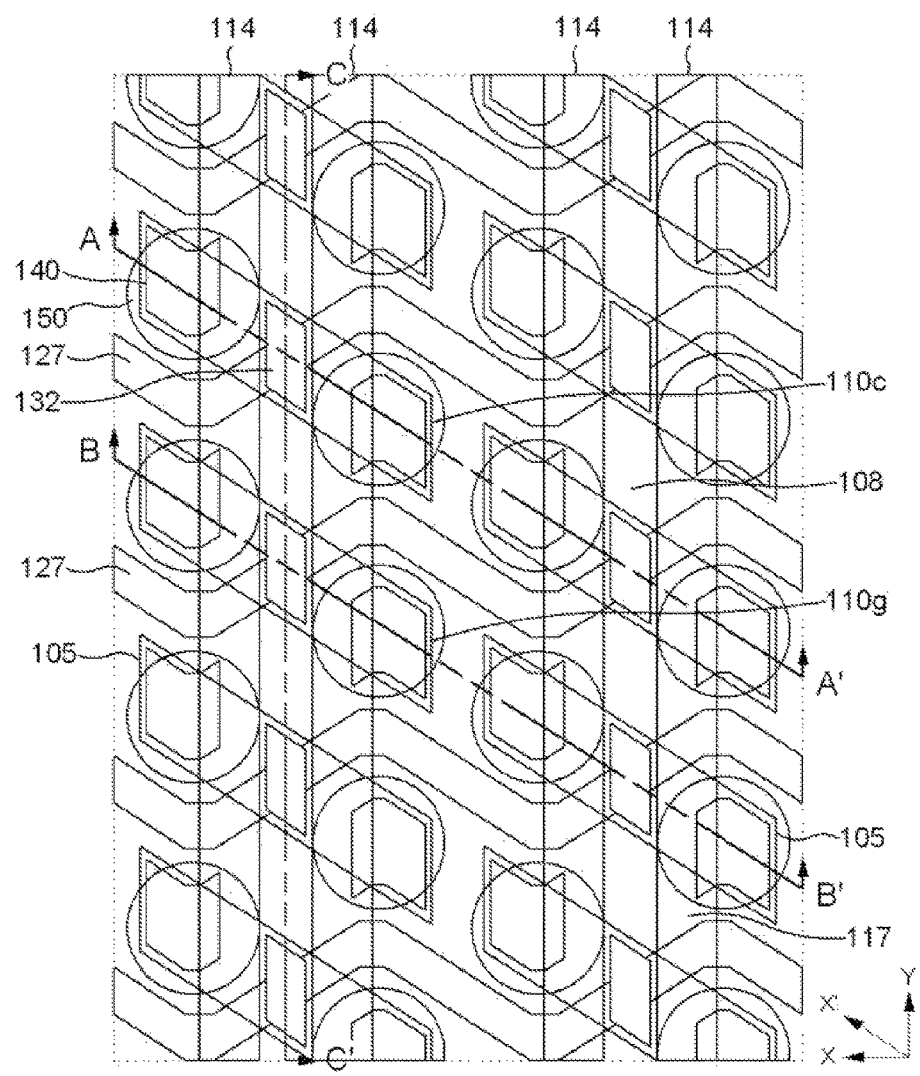
FIG. 1 is a plan view of a structure of DRAM which is a suitable semiconductor device to implement a manufacturing method in accordance with an embodiment of the present invention.

FIG. 1 is a schematic plan view of a structure of a semiconductor device according to a preferred embodiment of the present invention. FIG. 2(a) is a cross-sectional view of the semiconductor device along a line A-A' or a line B-B' in FIG. 1, and FIG. 2(c) is a cross-sectional view of the semiconductor device along a line C-C' in FIG. 1.

Figure 2:
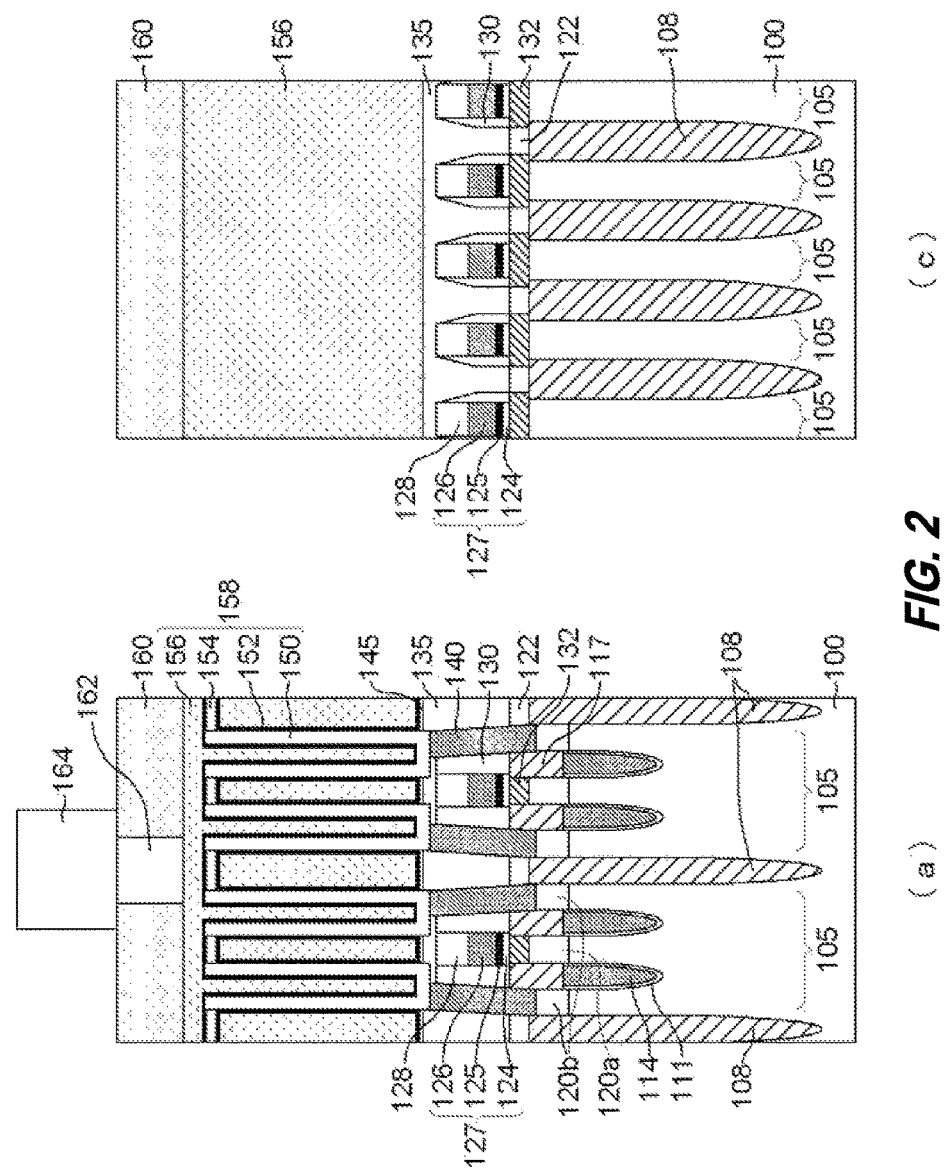
FIG. 2 (a) is a cross-sectional view of the semiconductor device along a line A-A' or a line B-B' in FIG. 1, (c) is a cross-sectional view of the semiconductor device along a line C-C' in FIG. 1.

As shown in FIGS. 1, 2 (a), and 2(c), a semiconductor device 1 according to this embodiment serves as a DRAM and includes a semiconductor substrate 100. This semiconductor substrate 100 is, for example, a silicon substrate. On the main surface of the semiconductor substrate 100, a field oxide film 108 making up isolation regions formed by the STI (Shallow Trench Isolation) method is buried. In a memory cell array area, multiple active areas 105 surrounded by the field oxide film 108 are formed.

Each of the multiple active areas 105 is of a parallelogram having two pairs of opposed sides one of which pairs extend in the Y direction while the other of which pairs extend in an X' direction inclined against the X and Y directions. The active areas 105 are arranged in repetition in the X and Y directions into a matrix formation. In each active area 105, two memory cells are formed. In the active area 105 located at an end of the memory cell array area, however, only one memory cell may be formed. As a width between the pair of opposed sides extending in the X' direction gets smaller and smaller to approach the resolution limit of an exposure system, the apexes of the parallelogram may become degenerated round shapes or the linear portions of the pair of opposed sides extending in the X' direction may become too obscure to visually recognize.

In the memory cell array area, multiple word lines (gate electrodes) 114 and multiple bit lines 127 are formed.

The word lines 114 are conductive patterns buried in gate trenches formed on the main surface of the semiconductor substrate 100. Between each conductive pattern and the inner surface of each gate trench, a gate dielectric film 111 is formed. The word line 114 is buried in the lower part of the gate trench, while a silicon nitride film 117 (cap dielectric film) covering the upper surface of the word line 114 is buried in the upper part of the gate trench. The silicon nitride film 117 is sandwiched between a storage node contact plug 140, which will be described later, the bit line 127, and the word line 114. The word lines 114 are extended linearly in the Y direction such that two word lines 114 pass through one active area 105. However, as shown in FIG. 1, only one word line 114 may pass through each active area 105 located at an end of the memory cell array area.

The bit lines 127 are made of conductive patterns formed above the main surface of the semiconductor substrate 100. Each bit line 127 meanders and passes through the centers of the active areas 105 arranged in the X direction, thus by and large extending in the X direction in terms of an overall view. According to this embodiment, the bit line 127 is a multilayer film composed of a poly-silicon film 124, a titanium nitride film 125, and a tungsten film 126. The upper surface of the bit line 127 is covered with a hard mask film (cover dielectric film) 128, whose upper surface is exposed from the upper surface of an interlayer dielectric film 122.

The hard mask film 128 is disposed between a cell capacitor 158 and the bit line 127. Each bit line 127 has its side faces covered with silicon nitride films (side face dielectric films) 130 each serving as a dielectric film. Each of these silicon nitride films (side face dielectric films) 130 is sandwiched between the storage node contact plug 140, which will be described later, and the bit line 127.

The internal structure of the active area 105 will be described. A p-well (not depicted) is formed in a region in the interior of semiconductor substrate 100 that is close to its surface, the interior of semiconductor substrate 100 being equivalent to the interior of active area 105. Inside the p-well, in a region close to the surface of the semiconductor substrate 100, diffusion layers 120a and 120b are formed by diffusing an n-type impurity into the region. Both of these diffusion layers 120a and 120b are formed by implanting impurity ions into the semiconductor substrate 100. As shown in FIG. 1, the diffusion layers 120a and 120b in the active area 105 are divided into three portions by two word lines 114 corresponding to the active area 105. Among the three portions, the diffusion layer 120a located at the center of the active area 105, that is, located between two word lines 114 serves as a source/drain region common to two cell transistors (access transistors) making up two memory cells included in the active area 105, and is connected to the bit line 127 corresponding to the diffusion layer 120a, via a bit line contact plug 132. The diffusion layers 120b and 120b, i.e., the other two portions, make up another source/drain region of the above two cell transistors, and are connected to lower electrodes 150 of the cell capacitors 158 corresponding to the diffusion layers 120b and 120b, via the storage node contact plugs 140.

An interlayer dielectric film 135 is formed on the main surface of the semiconductor device 100, and the bit line 127 is formed in this interlayer dielectric film 135. The position of the upper surface of the interlayer dielectric film 135 is adjusted so that the upper surface of the interlayer dielectric film 135 becomes flushed with the uppers surface of the hard mask film 128 covering the upper surface of the bit line 127.

The cell capacitors 158 are each composed of the lower electrode 150, a capacitance dielectric film 152, and an upper electrode 156.

The lower electrode 150 is a bottomed cylindrical conductor making up each cell capacitor 158. The lower electrode 150 is constructed by forming a cylindrical hole penetrating a dielectric film or silicon nitride film temporarily formed during the manufacturing process and then covering the inner surface of the cylindrical hole with the conductor.

As shown in FIG. 1, each lower electrode 150 is so located that it overlaps the corresponding storage node contact plug 140 in a plan view, and has its lower surface in contact with the storage node contact plug 140, as shown in FIGS. 2(a) and 2(b). The storage node contact plug 140 is so formed as to penetrate the interlayer dielectric film 122, and has a lower surface in contact with the corresponding diffusion layer 120b and an upper surface in contact with the lower electrode 150 of the corresponding cell capacitor 158.

On a part of the upper end of the lower electrode 150, as shown in FIG. 2(a), a support film 154 made of, for example, silicon nitride is formed, which support film 154 connects the lower electrode 150 to a different lower electrode 150.

The capacitance dielectric film 152 is a thin dielectric film covering the whole of the surface, which includes the inner and outer surfaces, of the bottomed cylindrical lower electrode 150. The upper electrode 156 is a conductor formed such that it is counter to the lower electrode 150 across the capacitance dielectric film 152. In other words, the cell capacitor 158 has a structure in which the lower electrode 150 and the upper electrode 156 are counter to each other across the capacitance dielectric film 152. As shown in FIGS. 2(a) and 2(b), the upper surface of the upper electrode 156 is covered with a silicon oxide film 160. The upper electrode 156 is connected to an upper line 164 via a contact plug 162 penetrating the silicon oxide film 160.

A method of manufacturing the semiconductor dice 1 will then be described.

Figure 3:
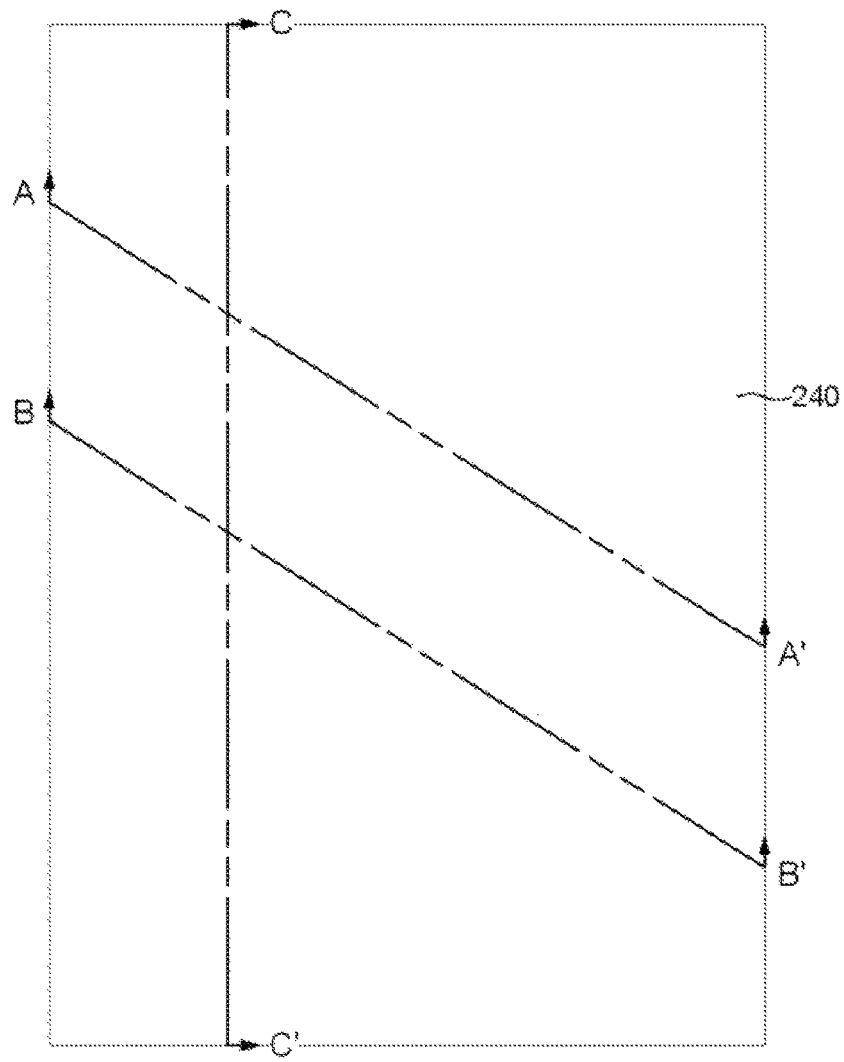
FIG. 3 is a plan view of a manufacturing method in accordance with an embodiment of the present invention.
Figure 4:
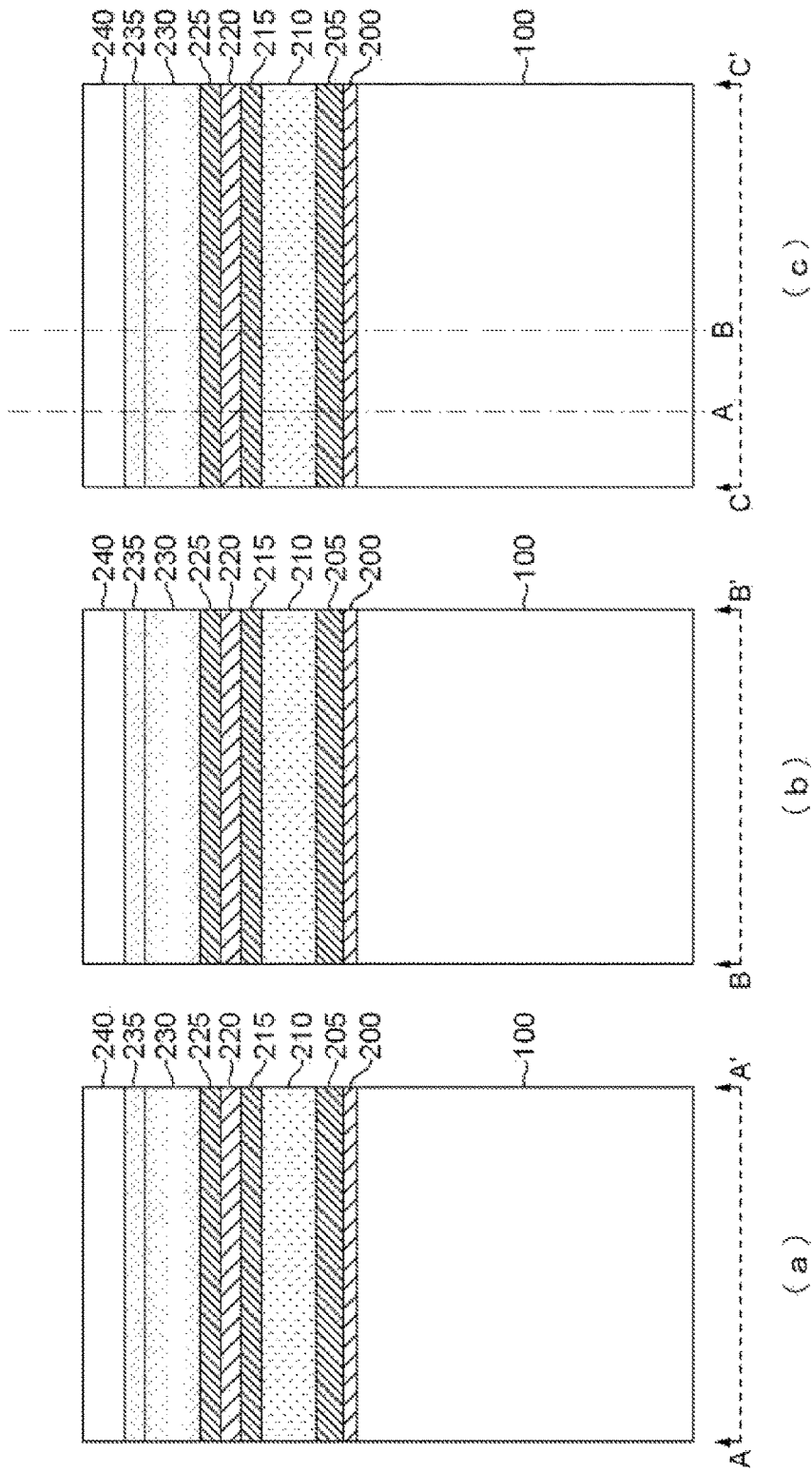
FIGS. 4 (a), (b), (c) are cross-sectional views of a manufacturing method in accordance with an embodiment along the line A-A', B-B', C-C' in FIG. 3, respectively.
Figure 5:
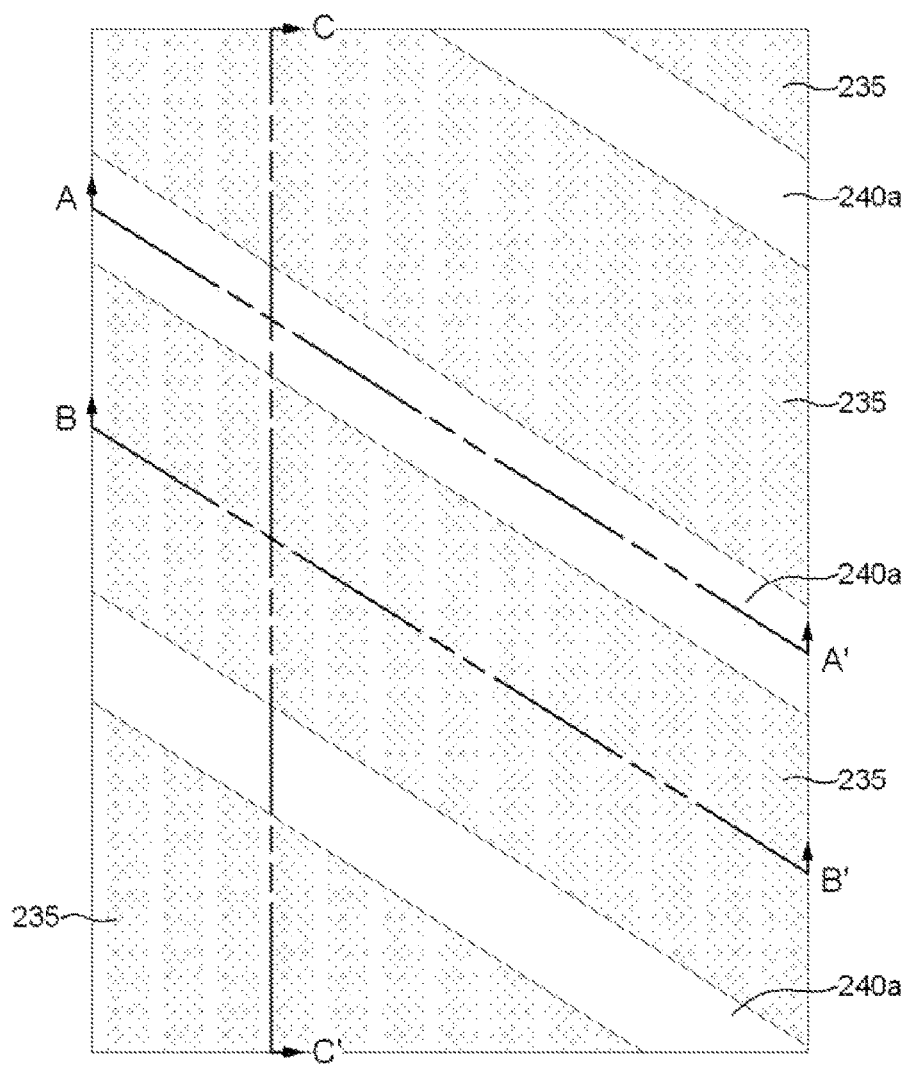
FIG. 5 is a plan view of a manufacturing method in accordance with an embodiment of the present invention.
Figure 6:
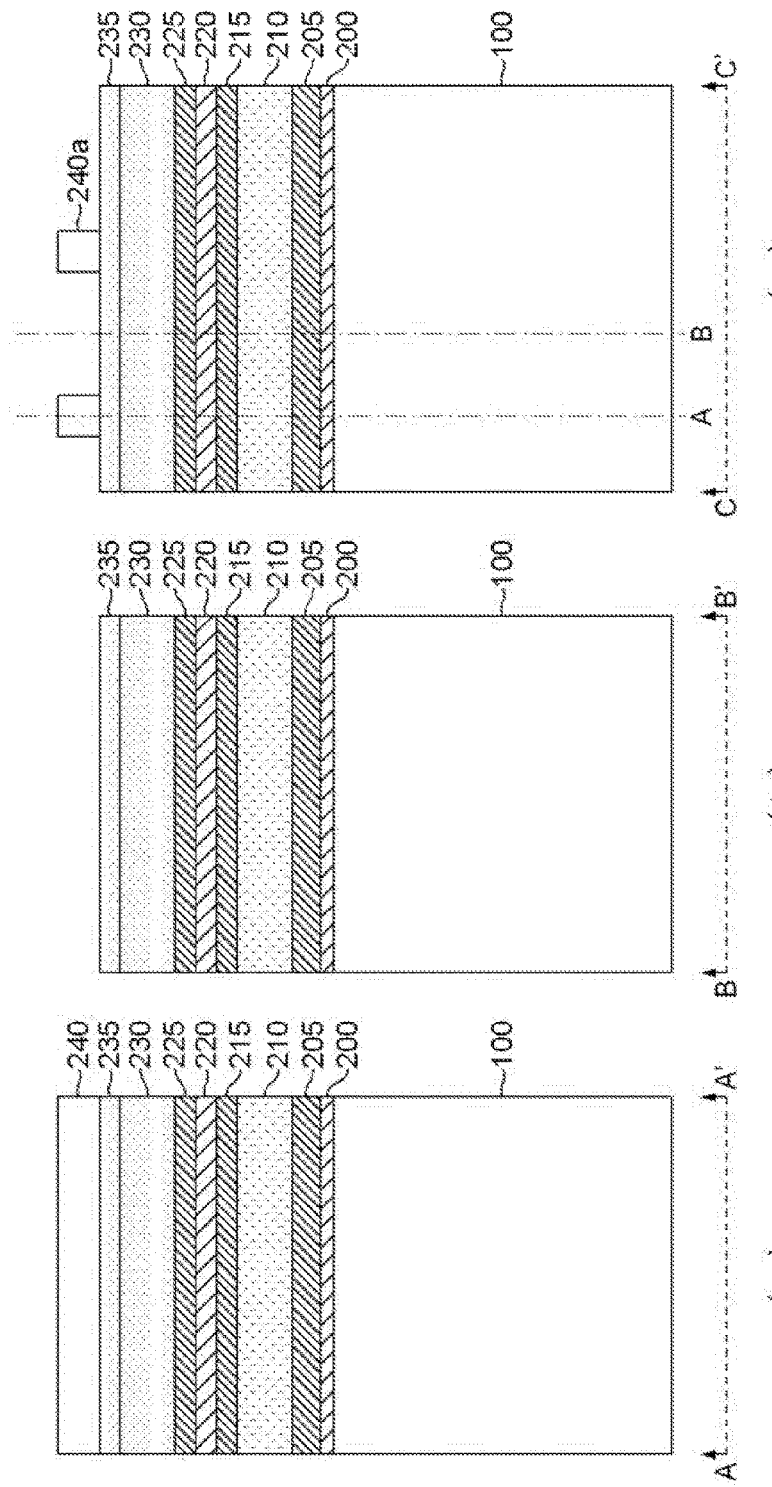
FIGS. 6 (a), (b), (c) are cross-sectional views of a manufacturing method in accordance with an embodiment along the line A-A', B-B', C-C' in FIG. 5, respectively.
Figure 7:
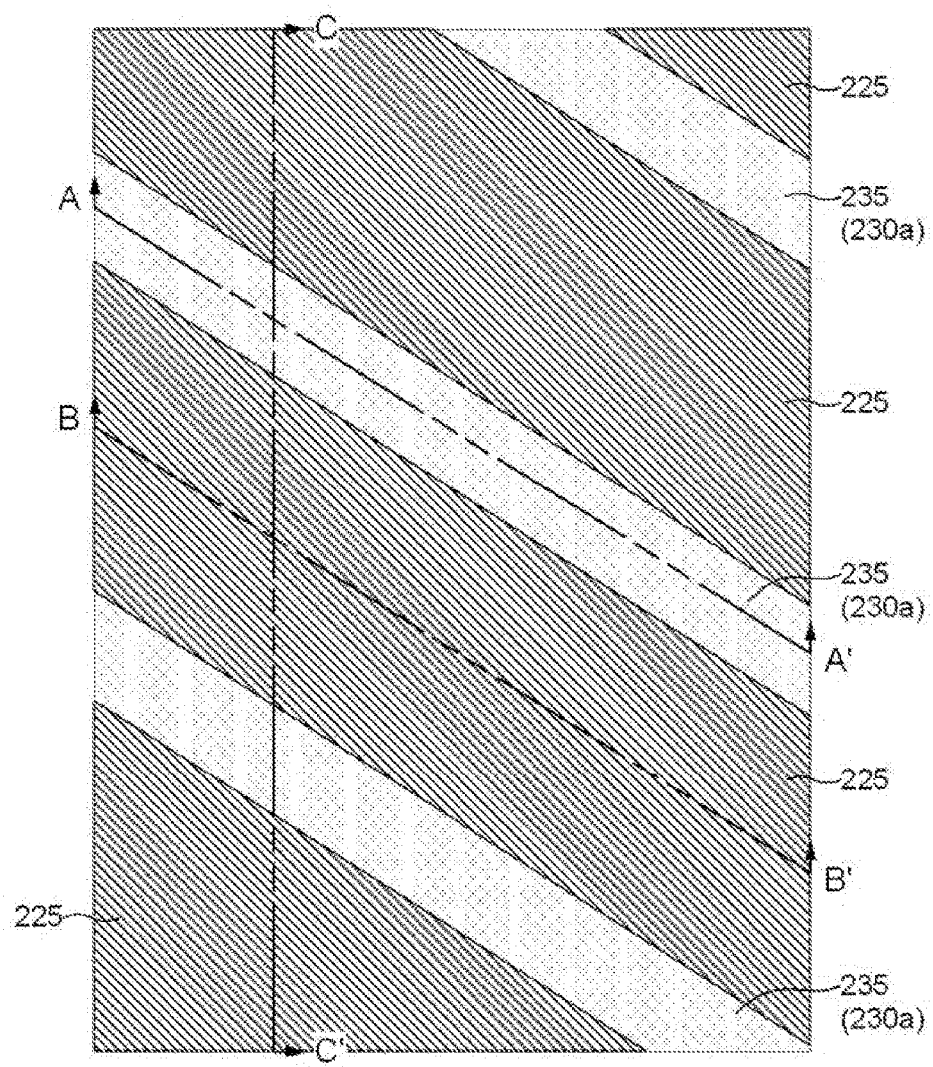
FIG. 7 is a plan view of a manufacturing method in accordance with an embodiment of the present invention.
Figure 8:
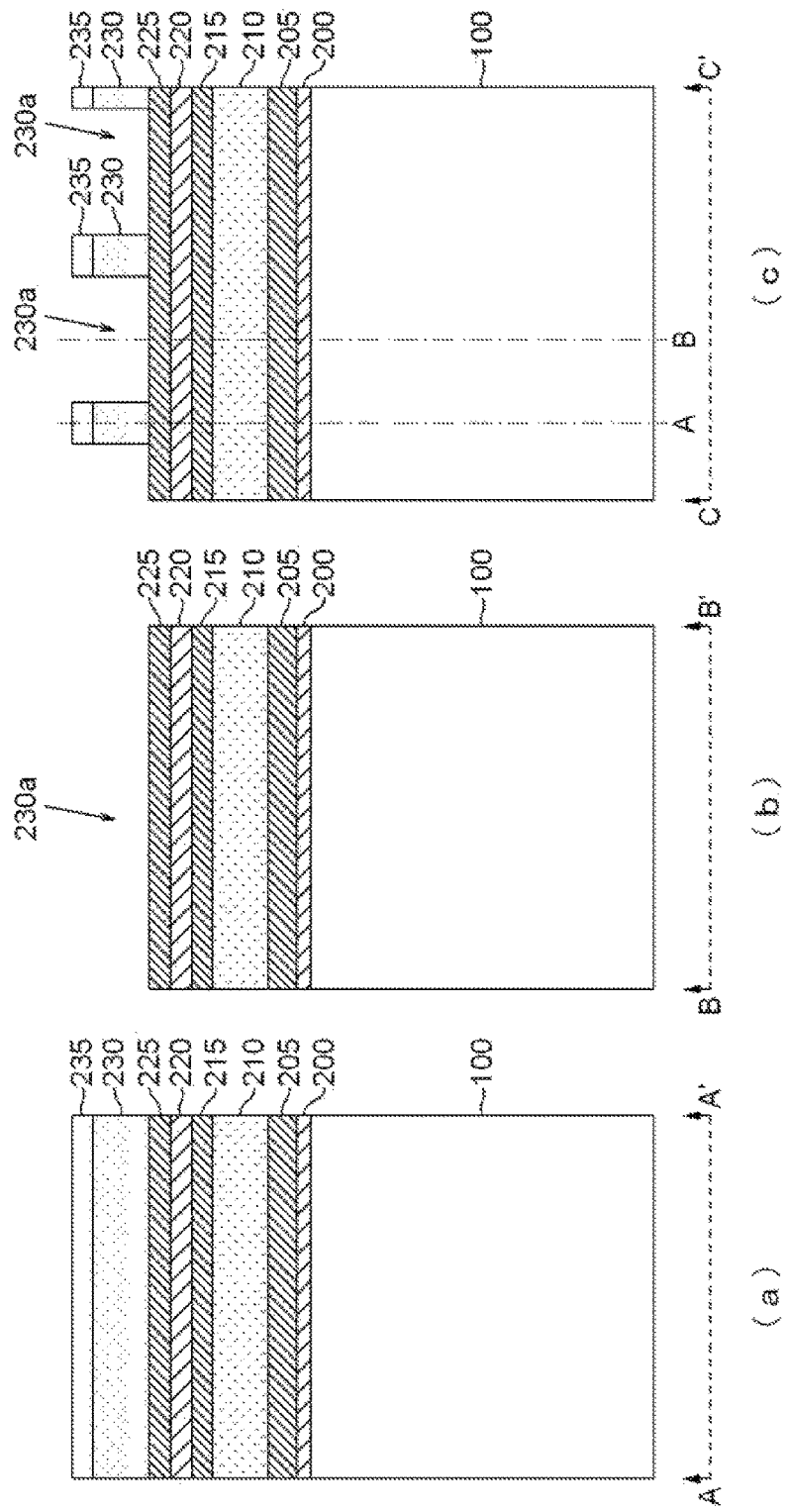
FIGS. 8 (a), (b), (c) are cross-sectional views of a manufacturing method in accordance with an embodiment along the line A-A', B-B', C-C' in FIG. 7, respectively.
Figure 9:
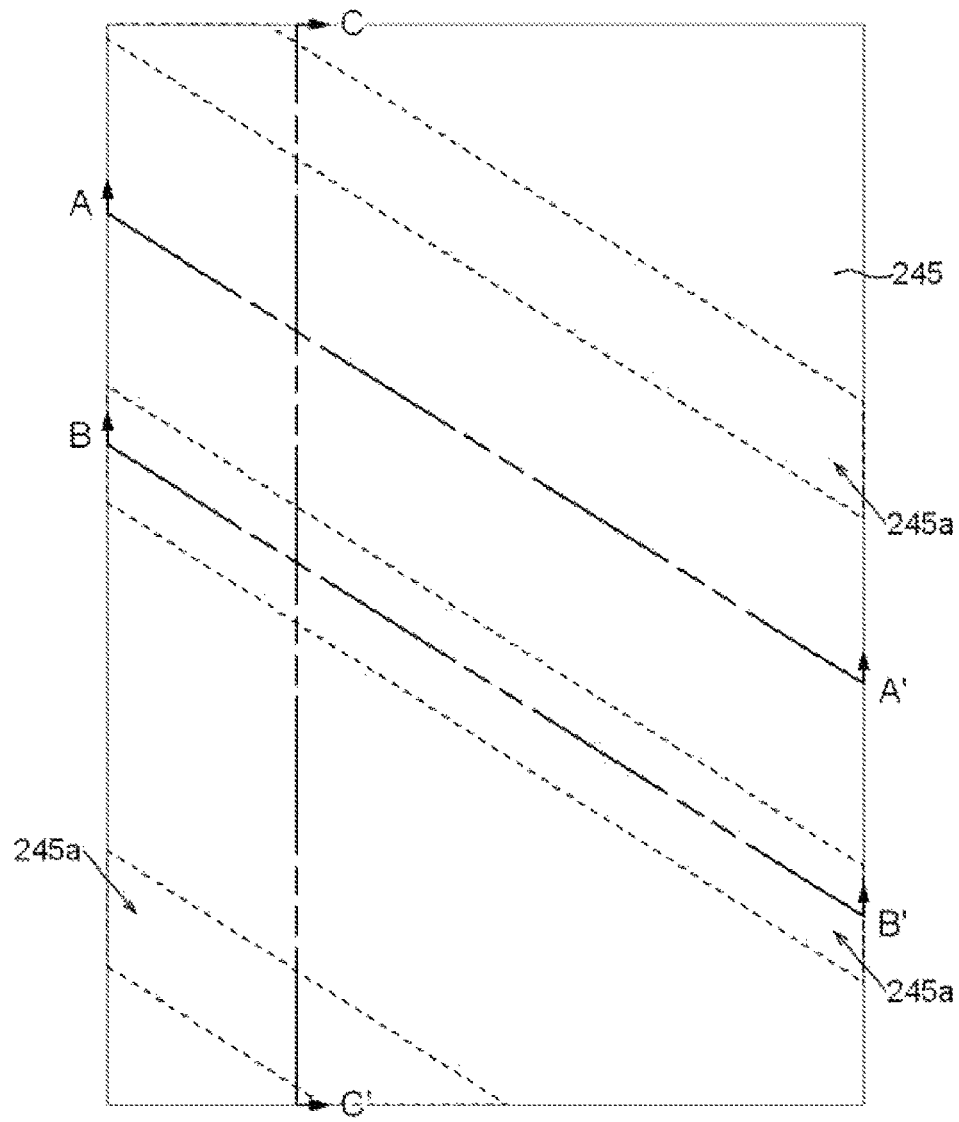
FIG. 9 is a plan view of a manufacturing method in accordance with an embodiment of the present invention.
Figure 10:
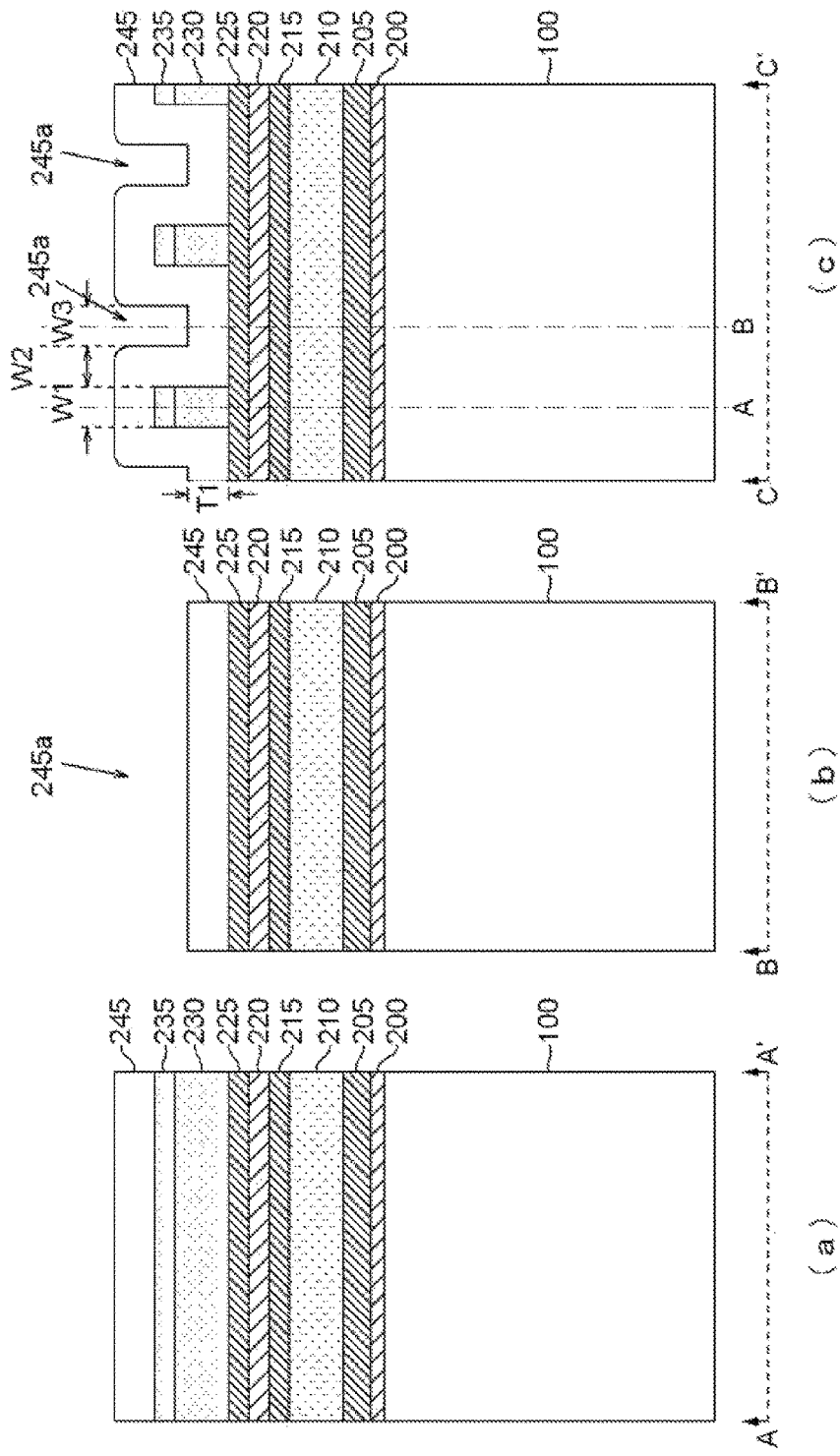
FIGS. 10 (a), (b), (c) are cross-sectional views of a manufacturing method in accordance with an embodiment along the line A-A', B-B', C-C' in FIG. 9, respectively.
Figure 11:
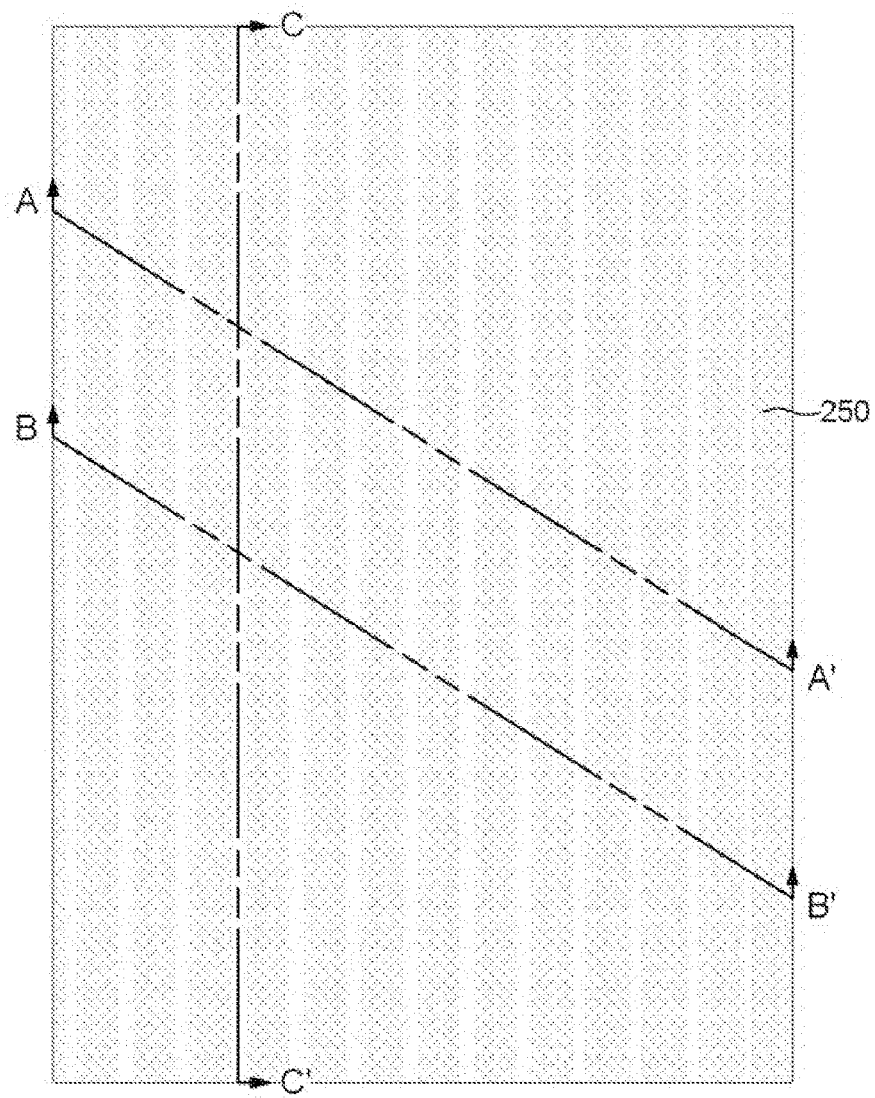
FIG. 11 is a plan view of a manufacturing method in accordance with an embodiment of the present invention.
Figure 12:
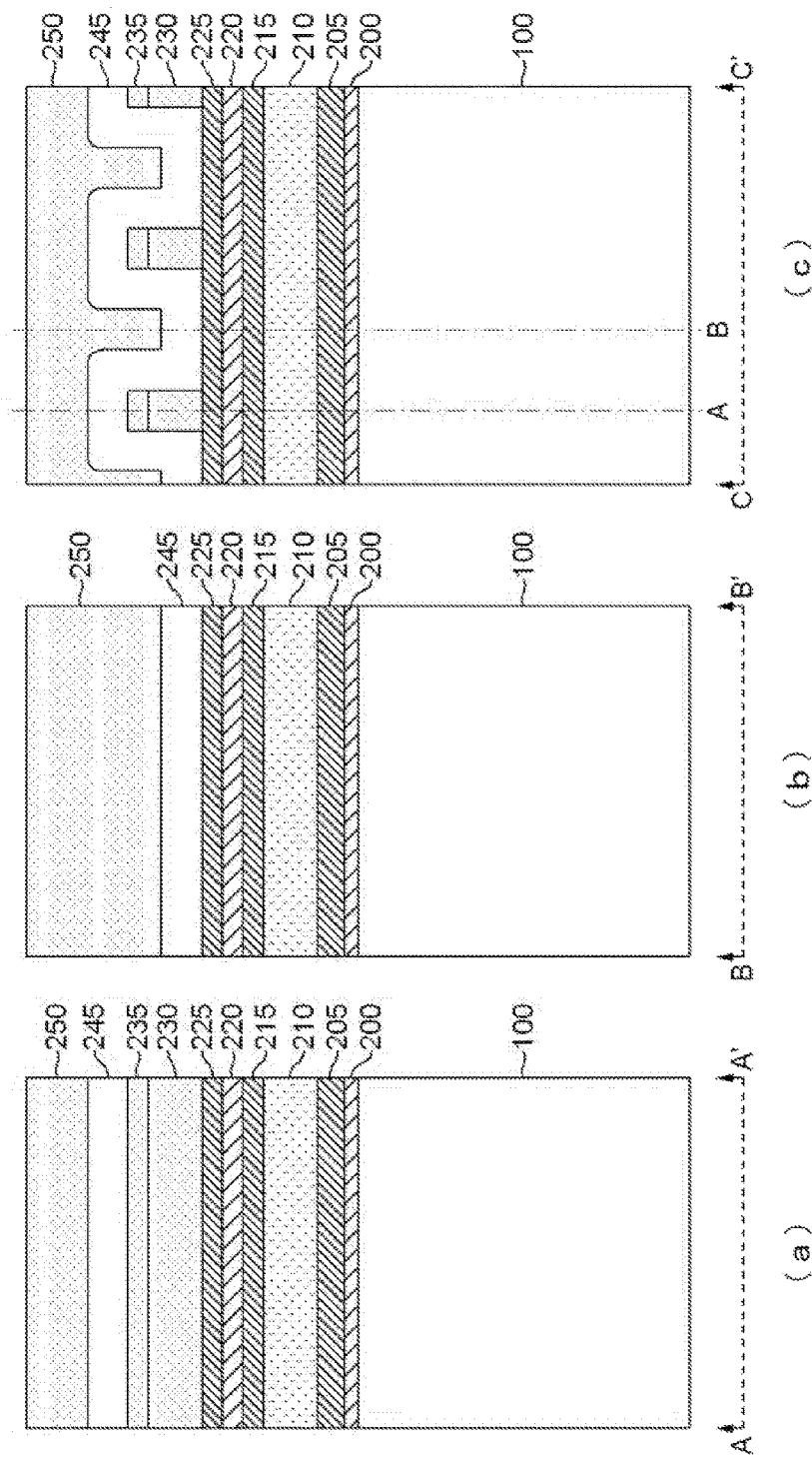
FIGS. 12 (a), (b), (c) are cross-sectional views of a manufacturing method in accordance with an embodiment along the line A-A', B-B', C-C' in FIG. 11, respectively.
Figure 13:
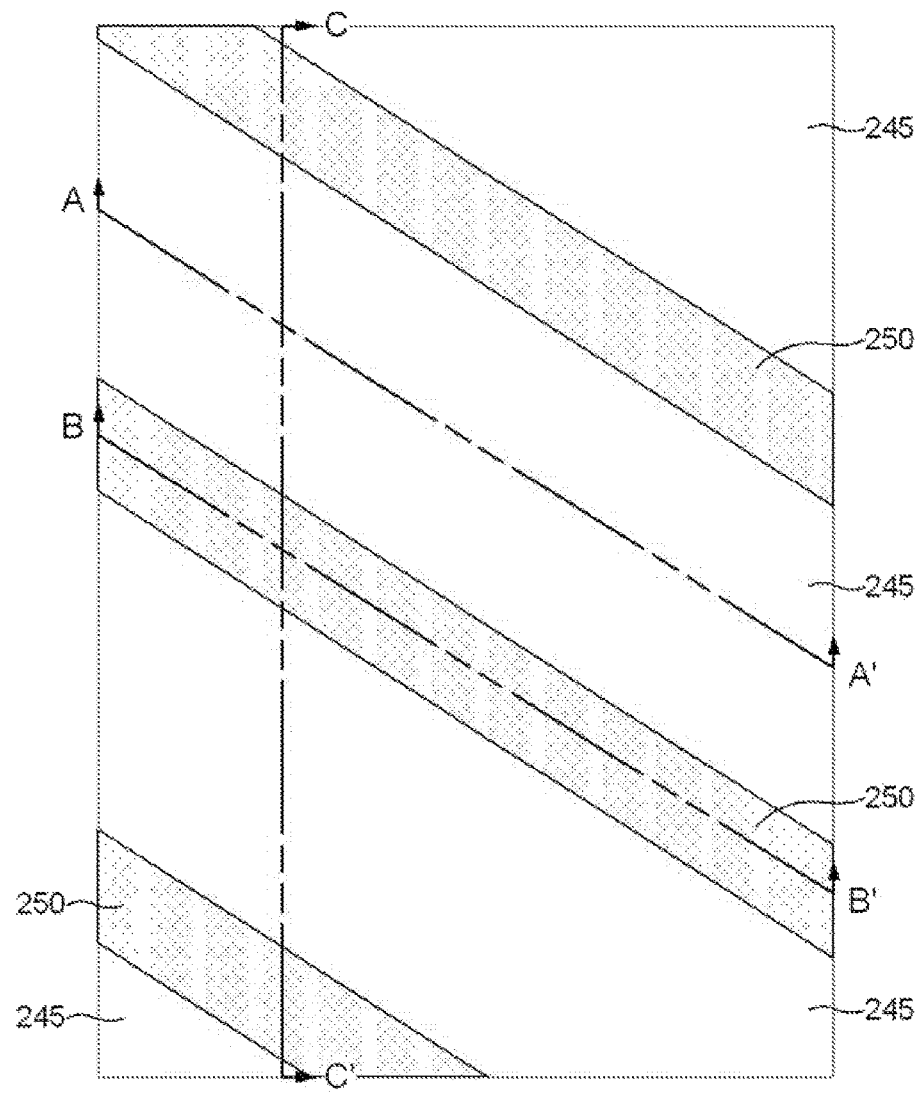
FIG. 13 is a plan view of a manufacturing method in accordance with an embodiment of the present invention.
Figure 14:
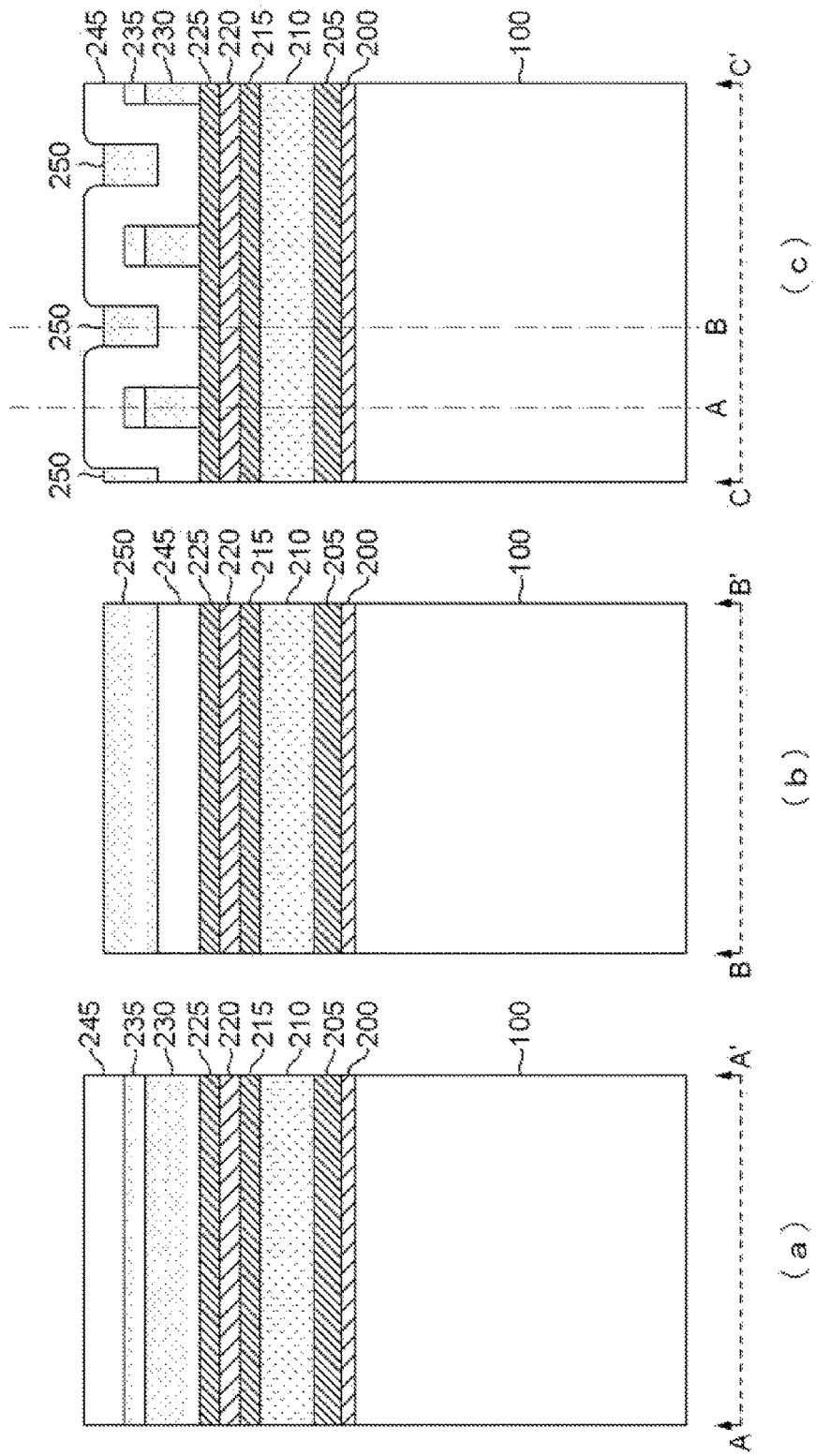
FIGS. 14 (a), (b), (c) are cross-sectional views of a manufacturing method in accordance with an embodiment along the line A-A', B-B', C-C' in FIG. 13, respectively.
Figure 15:
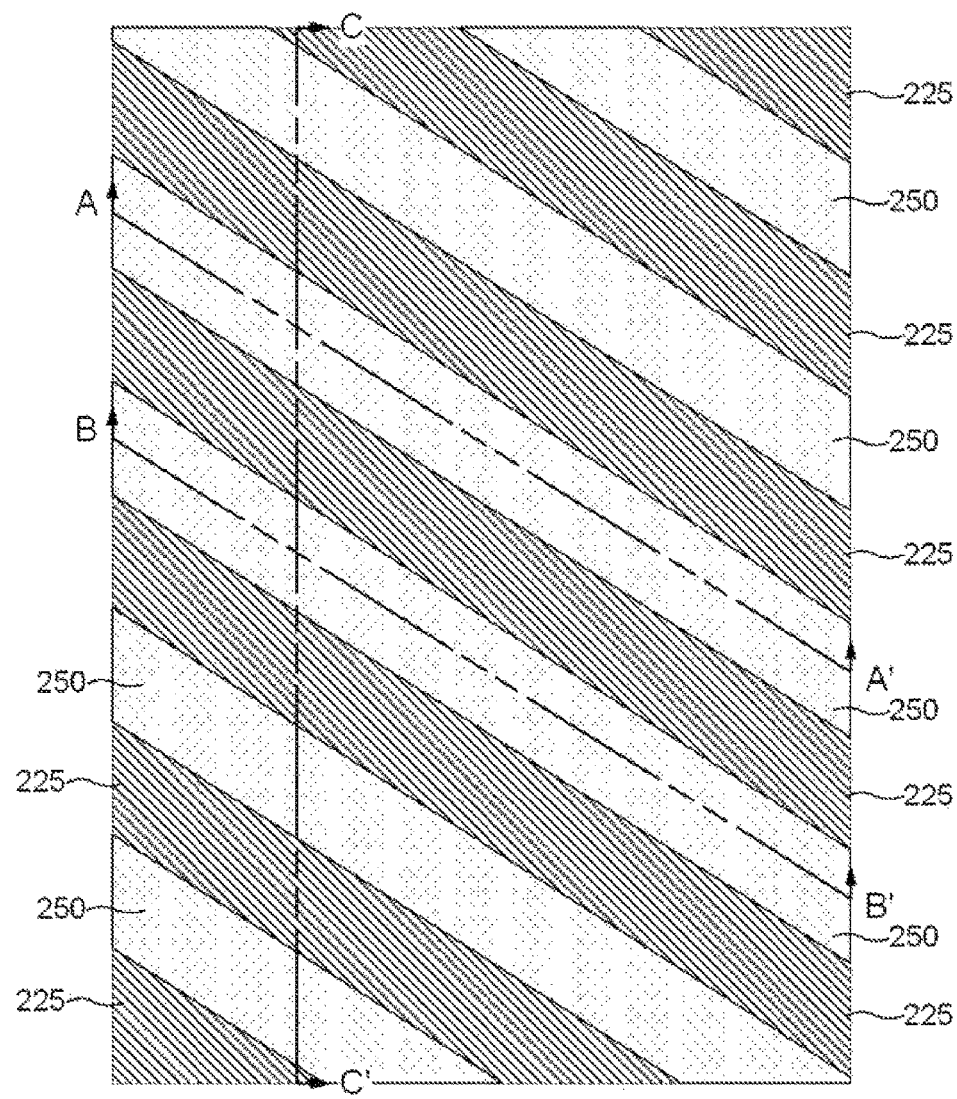
FIG. 15 is a plan view of a manufacturing method in accordance with an embodiment of the present invention.
Figure 16:
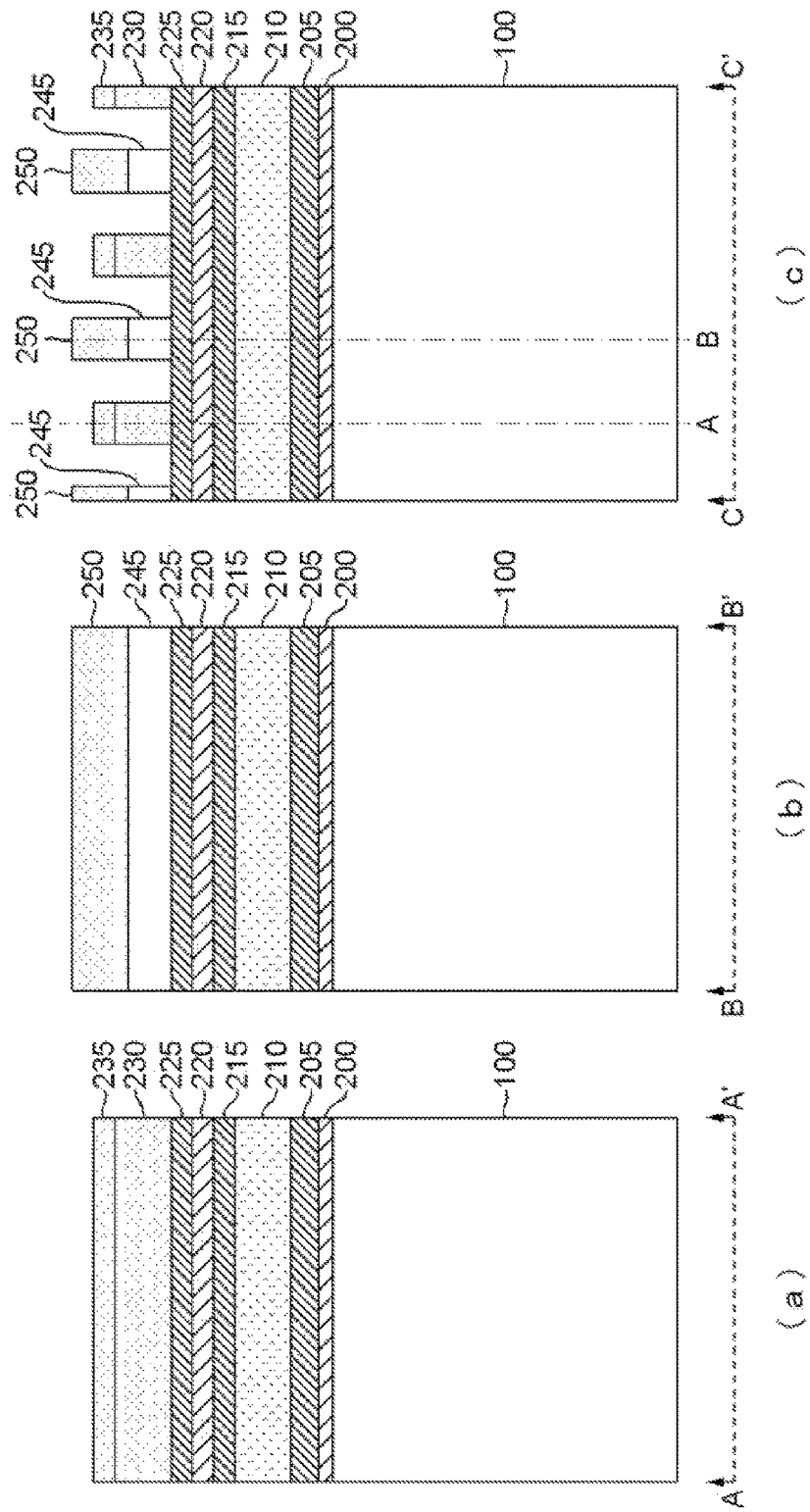
FIGS. 16 (a), (b), (c) are cross-sectional views of a manufacturing method in accordance with an embodiment along the line A-A', B-B', C-C' in FIG. 15, respectively.
Figure 17:
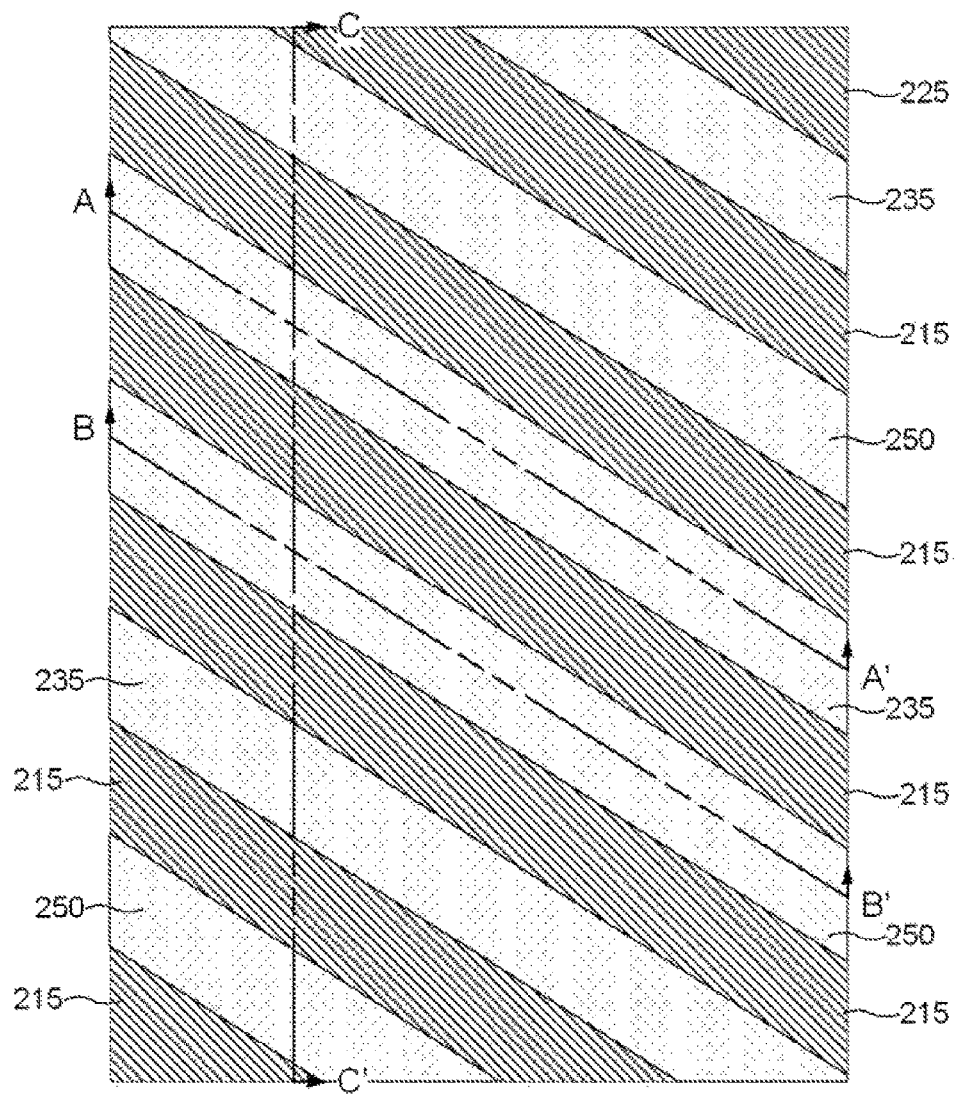
FIG. 17 is a plan view of a manufacturing method in accordance with an embodiment of the present invention.
Figure 18:
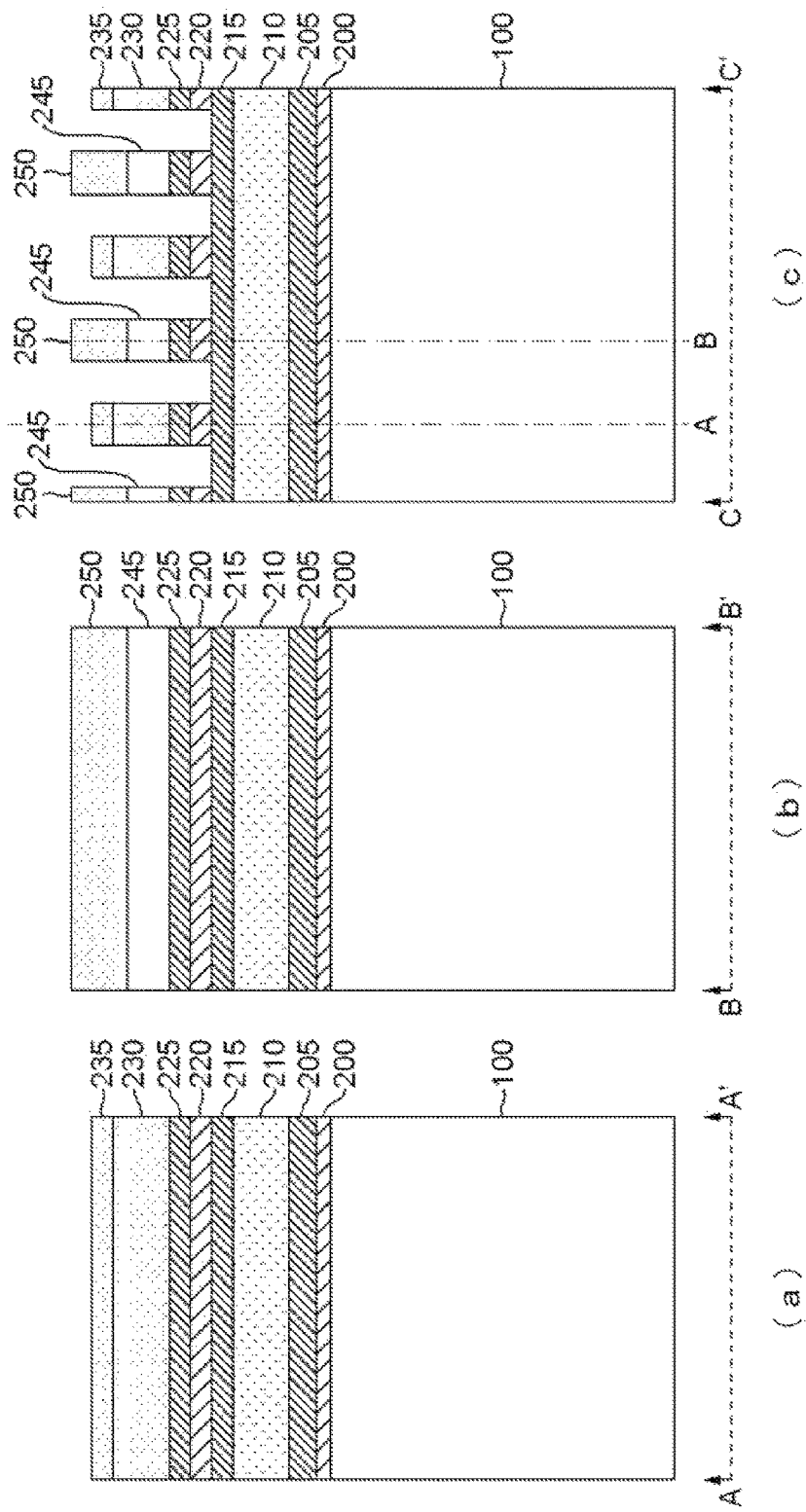
FIGS. 18 (a), (b), (c) are cross-sectional views of a manufacturing method in accordance with an embodiment along the line A-A', B-B', C-C' in FIG. 17, respectively.
Figure 19:
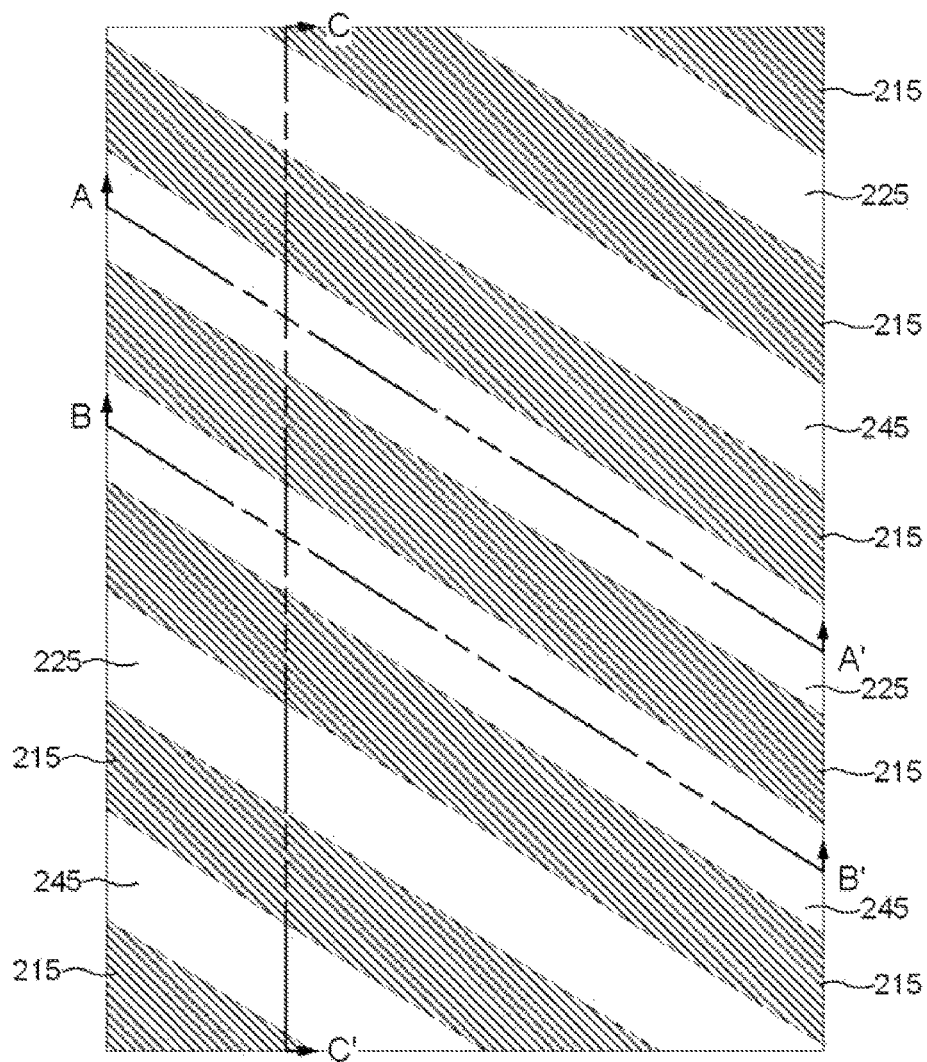
FIG. 19 is a plan view of a manufacturing method in accordance with an embodiment of the present invention.
Figure 20:
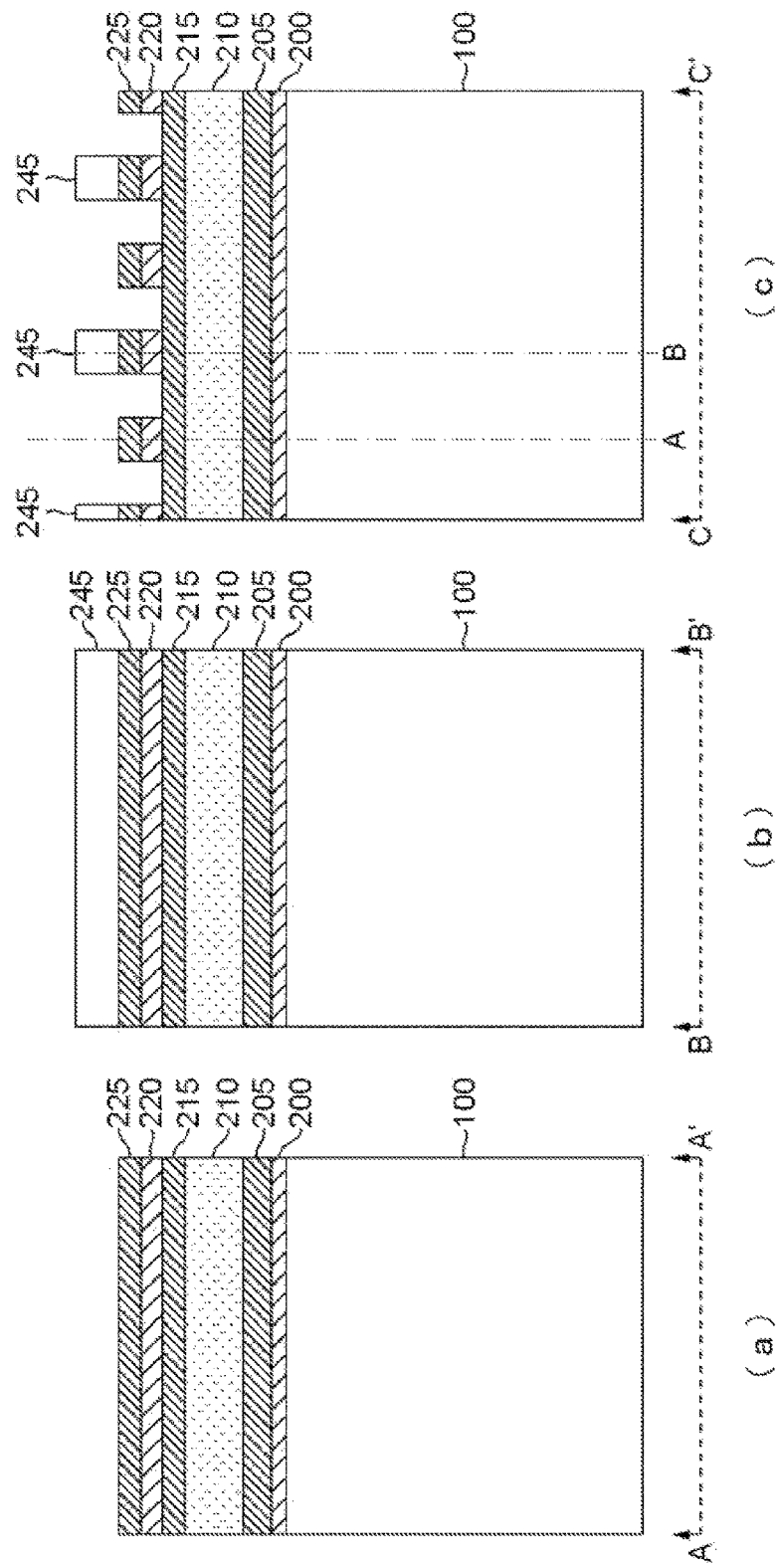
FIGS. 20 (a), (b), (c) are cross-sectional views of a manufacturing method in accordance with an embodiment along the line A-A', B-B', C-C' in FIG. 19, respectively.
Figure 21:
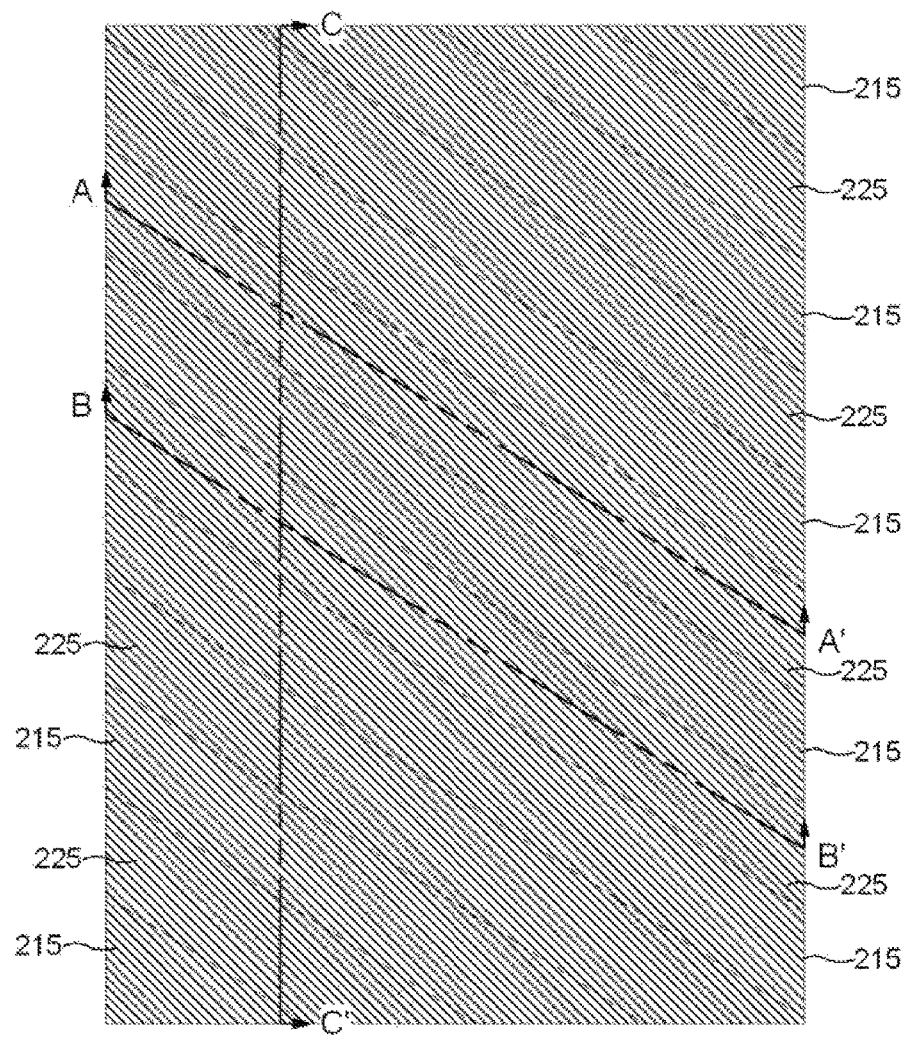
FIG. 21 is a plan view of a manufacturing method in accordance with an embodiment of the present invention.
Figure 22:
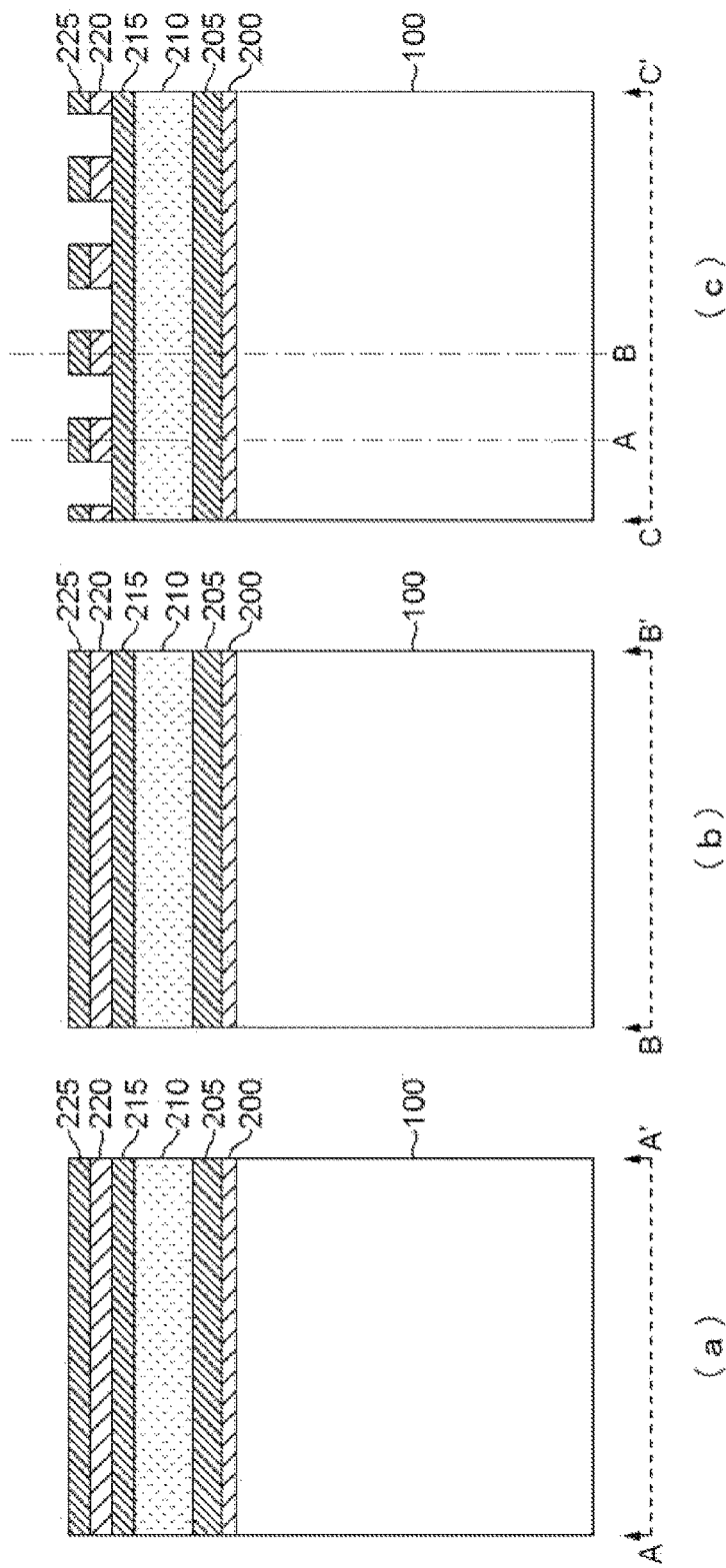
FIGS. 22 (a), (b), (c) are cross-sectional views of a manufacturing method in accordance with an embodiment along the line A-A', B-B', C-C' in FIG. 21, respectively.
Figure 23:
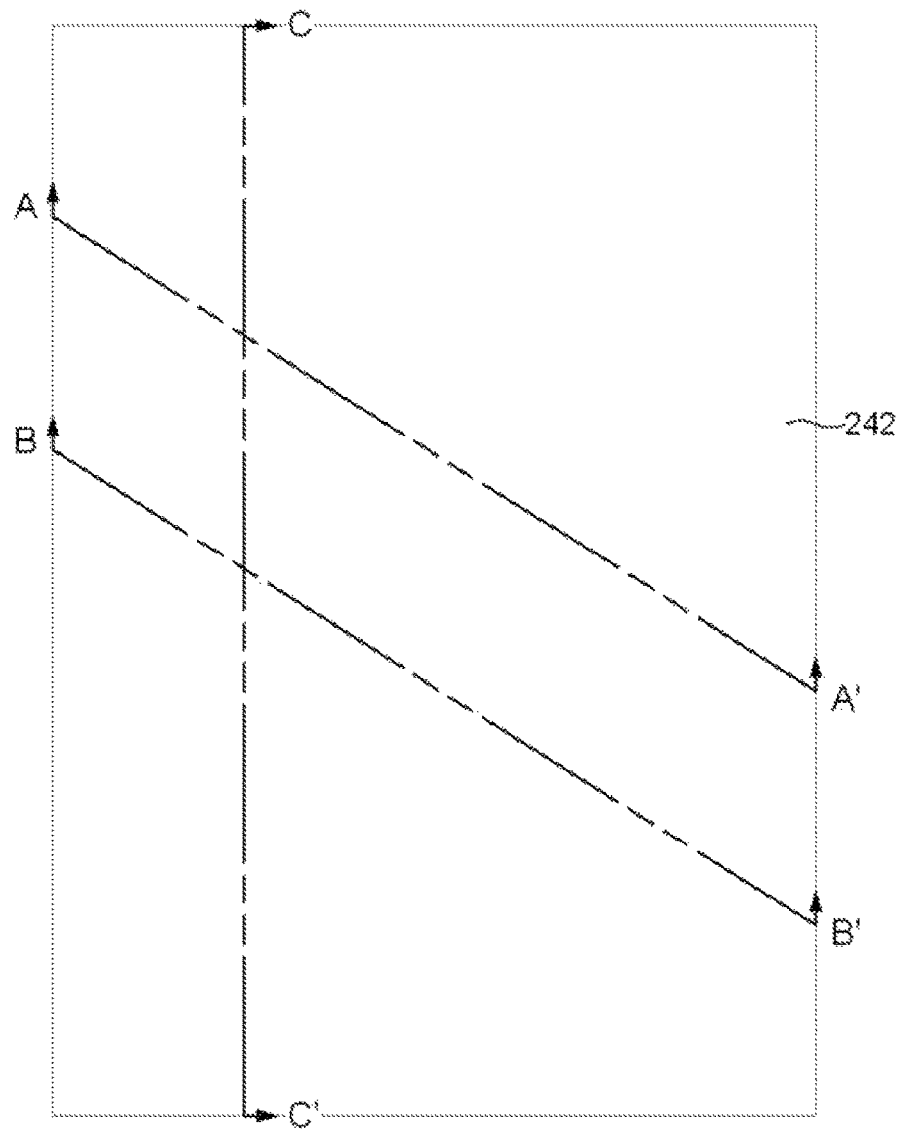
FIG. 23 is a plan view of a manufacturing method in accordance with an embodiment of the present invention.
Figure 24:
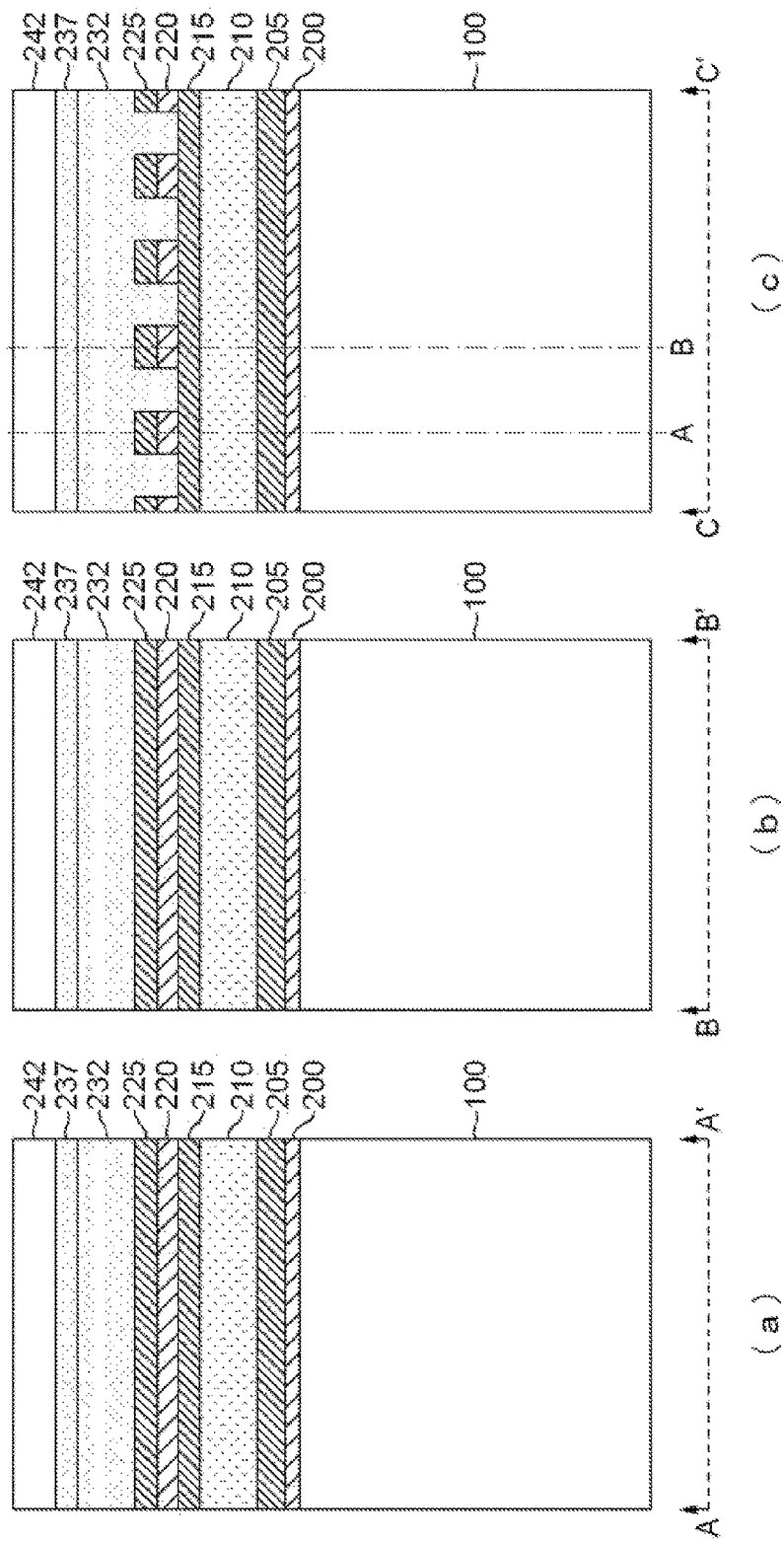
FIGS. 24 (a), (b), (c) are cross-sectional views of a manufacturing method in accordance with an embodiment along the line A-A', B-B', C-C' in FIG. 23, respectively.
Figure 25:
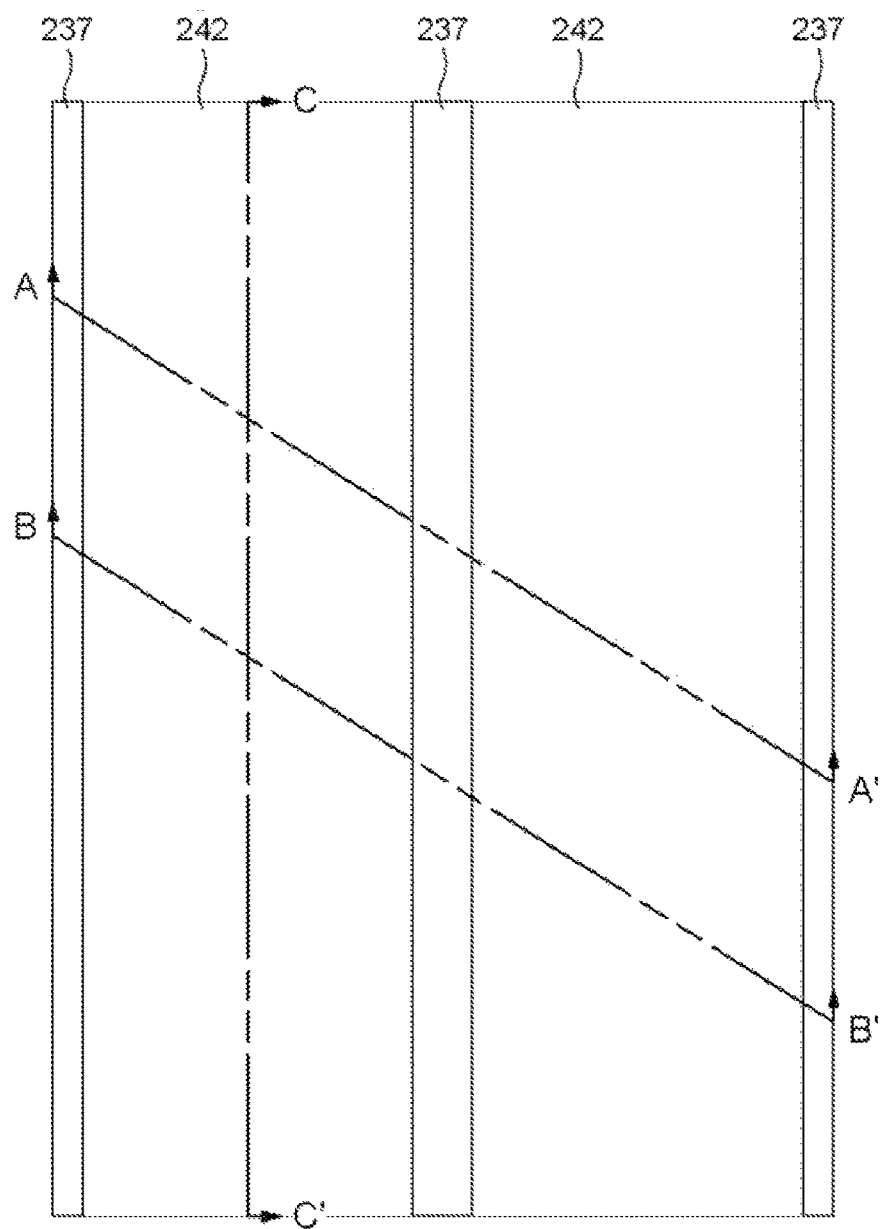
FIG. 25 is a plan view of a manufacturing method in accordance with an embodiment of the present invention.

FIGS. 3 to 38 are diagrams for explaining a method of manufacturing the semiconductor device according to a first embodiment of the present invention. Of these diagrams, diagrams denoted by odd figure numbers (FIG. 3, etc.) are plan views and diagrams denoted by even figure numbers (FIG. 4, etc.) are cross-sectional views. Diagrams denoted by even figure numbers with (a) appended thereto are cross-sectional views taken along the line A-A' in FIG. 1, the same with (b) appended thereto are cross-sectional views taken along the line B-B' in FIG. 1, and the same with (c) appended thereto are cross-sectional views taken along the line C-C' in FIG. 1.

As shown in FIGS. 3, 4(a), 4(b), and 4(c), a pad dielectric film 200, a field nitride film 205, a carbon film 210, a first mask material layer 215, a second mask material layer 220, and a third mask material layer 225 are formed in increasing order on the semiconductor substrate 100, and then a three-layer resist is formed on the third mask material layer 225 by depositing a first organic film 230, a first silicon-containing film 235, and a first photoresist 240 in increasing order on the third mask material layer 225.

The pad dielectric film 200 and field nitride film 205 are patterned into the same shape as the shape of isolation trenches 103 in the semiconductor substrate 100 (see FIG. 36), and serve as stopper layers that are used when the field oxide film 108 (see FIGS. 2 and 38) is so formed as to fill up the isolation trenches 103 and the residual oxide film left on the part other than the isolation trenches is eliminated by CMP (Chemical/Mechanical Polishing) or anisotropic etching. The field nitride film 205 has a thickness that is needed to allow the field nitride film 205 to work effectively as the stopper layer against CMP or etching.

The carbon film 210 is a hard mask that is used when the field nitride film 205, pad dielectric film 200, and semiconductor substrate 100 are etched for patterning. The carbon film 210, therefore, must have a thickness that allows the carbon film 210 to at least withstand etching of the field nitride film 205.

The first mask material layer 215 is a hard mask material used for patterning the carbon film 210. For the first mask material layer 215, an etching condition that realizes a desired selective etching ratio of etching on the carbon film 210 must be set. It is preferable, if not absolutely necessary, that the first mask material layer 215 be a silicon nitride film (SiN) or silicon oxynitride film (SiON).

The second mask material layer 220 is a layer that is used for synthesizing line-and-space patterns (first and second mask patterns) in the X' direction formed by the first round of lithography and etching and space patterns or hole patterns (third mask patterns) in the Y direction formed by the second round of lithography and etching. For the second mask material layer 220, an etching condition that realizes a desired selective etching ratio of etching on the first mask material layer 215 and third mask material layer 225 must be set. It is preferable that the second mask material layer 220 be, for example, a silicon oxide film (SiO).

The third mask material layer 225 is a hard mask that is used for patterning the second mask material layer 220, and serves as an etching stopper when a spacer material 245, which will be described later, is etched. For the third mask material layer 225, therefore, an etching condition that realizes a desired selective etching ratio of etching on the second mask material layer 220 and spacer material 245 must be set. The third mask material layer 225 is, for example, a silicon nitride film (SiN) or silicon oxynitride film (SiON), and the spacer material 245 should preferably be a silicon oxide film. The third mask material layer 225 may be thinner than that of the first mask material layer 215.

The first organic film 230 should preferably be sufficiently thicker than a minimum interval to be formed and provide an almost flat surface when filling up recessions of a substrate. The first silicon-containing film 235 should preferably have etching resistance higher than that of the first photoresist 240, and may be an organic film containing silicon of about 40 wt. % or SOD (Spin on Dielectric) film. The first organic film 230 and first silicon-containing film 235 should preferably be formed by spin coating.

The first photoresist 240 has etching resistance sufficient for patterning the first silicon-containing film 235 and first organic film 230. Like the above first organic film 230, the first photoresist 240 can be formed by, for example, spin coating of an ArF photoresist.

Subsequently, as shown in FIGS. 5 and 6(a), 6(b), and 6(c), the first photoresist 240 is processed to form a first resist pattern 240a serving as core portions. The first resist pattern 240a is formed by patterning using an ArF immersion exposure system. The first resist pattern 240a is a pattern formed by arranging linear openings extending in the X' direction, repetitively at given intervals in the Y direction. It is preferable that a space between lines of the resist pattern 24 that are adjacent to each other be 2 or 3 times as large in width as each line of the resist pattern.

Subsequently, as shown in FIGS. 7, 8(a), 8(b), and 8(c), the first silicon-containing film 235 and first organic film 230 are anisotropically etched, using the first resist pattern 240a as an etching mask, to transfer the first resist pattern 240a to the first silicon-containing film 235 and first organic film 230, thereby form the core portions (first mask pattern core portions 235/230) each composed of the first silicon-containing film 235 and first organic film 230. As a result of this anisotropic etching, openings 230a penetrating the first silicon-containing film 235 and first organic film 230 are formed under the openings of the first resist pattern 240a, where the surface of the third mask material layer 225 is exposed in the openings 230a.

Subsequently, as shown in FIGS. 9 and 10(a), 10(b), and 10(c), a sacrifice film, e.g., a space material 245 covering the side faces of the first silicon-containing film 235 and first organic film 230 penetrated by the openings 230a, is formed uniformly. The spacer material 245 may be formed such that its thickness on the side faces of the first organic film 230 is determined to be smaller than the lithography resolution limit. Formation of the spacer material 245 is performed under a temperature lower than the heat resistance temperature of the first organic film 230 and first silicon-containing film 235 and is so performed as to offer superior step coverage covering steps formed by the openings 230a. Specifically, the spacer material 245 is formed under a temperature equal to or lower than 200° C. or, preferably, equal to or lower than 50° C. The sacrifice film should preferably be made of silicon oxide. However, not only the silicon oxide but also a material which can be formed under a temperature equal to or lower than 200° C., offers fine step coverage for the side faces of the core portions, and allows adoption of a selective etching ratio of etching on an organic film is applicable as the sacrifice film.

The spacer material 245 is given a thickness with which the spacer material 245 does not fill up each opening 230a completely. For example, when the arrangement pitch of the core portions is 100 nm and the width W1 of each core portion is 25 nm, the thickness T1 of the spacer material 245 formed on the side faces of the opening 230a is determined to be 25 nm that is equal to the width W1. As a result, a recession 245a of spacer material 245 that has a width W3 of 25 nm is formed in each opening 230a. In this case, the width W1 of the core portion composed of the first organic film 230 and first silicon-containing film 235, the width W2 of the side wall spacer made of the spacer material 245, and the width W3 of the recession 245a of the spacer material 245 are all equal to each other. However, it is not necessary to make all the widths W1, W2, and W3 equal to each other. For example, the width W1 is determined to be 30 nm and the thickness T1 is determined to be 20 nm to form the spacer material 245 with the widths W1 and W3 each determined to be 30 nm and the width W2 determined to be 20 nm.

Subsequently, as shown in FIGS. 11, 12(a), 12(b), and 12(c), a second organic film 250 is formed on the spacer material 245 to fill the recessions 245a of the spacer material 245 with the second organic film 250. It is preferable that the second organic film 250 have a thickness with which the second organic film 250 fills up the recessions 245a and yet has an almost flat surface. In other words, the material that fills up the recessions 245a is not selected from limited types of materials but may be selected from any types of materials that have desired recession-filling properties and flatness and are formed under a temperature lower than the heat resistance temperature of the first organic film 230 and first silicon-containing film 235. For example, such a material may be selected from a photoresist, SOD (Spin on Dielectric) film, etc.

Subsequently, as shown in FIGS. 13, 14(a), 14(b), and 14(c), the second organic film 250 on the spacer material 245 is eliminated by anisotropic etching to expose the top surface of the spacer material 245 while leaving part of the second organic film 250 in the recessions 245a of the spacer material 245. As a result, a gap portion bury mask (second mask pattern) composed of the second organic film 250 buried in the recessions 245a is formed. The width of the bury mask composed of the second organic film 250 is equal to the width of the recession 245a.

Subsequently, as shown in FIGS. 15, 16(a), 16(b), and 16(c), the wall spacer made of the spacer material 245 is eliminated selectively by anisotropic etching. This etching is performed under a condition that allows adoption of a selective etching ratio of etching on the second organic film 250, first silicon-containing film 235, and first organic film 230 and is carried out to selectively eliminate the side wall spacer only. This etching exposes the upper surface and both side faces of the core portions each composed of the first silicon-containing film 235 and first organic film 230 and forms gap portions each of which is a lamination of the second organic film 250 and the spacer material 245. The upper surface of the third mask material layer 225 is also exposed in areas between the core portions and the gap portions, in which areas the side wall spacer has been placed until the etching.

According to this embodiment, the condition for anisotropic etching of the side wall spacer composed of the spacer material 245 is set as a desired selective etching ratio for the third mask material layer 225. This allows protection of the structure under the second mask material layer 220.

Subsequently, as shown in FIGS. 17, 18(a), 18(b), and 18(c), the third mask material layer 225 and the second mask material layer 220 are selectively eliminated by anisotropic etching using the second organic film 250, first silicon-containing film 235, and first organic film 230 as an etching mask. By this etching, a line-and-space pattern consisting of alternating lines of core portions along two-dot broken lines A-A' shown in FIG. 17 (FIG. 18(a)) and gap portions along two-dot broken lines B-B' shown in FIG. 17 (FIG. 18(b)) is transferred to the second mask material layer 220.

Subsequently, as shown in FIGS. 19, 20(a), 20(b), and 20(c), the second organic film 250, first silicon-containing film 235, and first organic film 230 are eliminated by plasma ashing. During the plasma ashing, the carbon film 210 covered with the first mask material layer 215 is protected from the ashing process and is therefore kept intact. The spacer material 245 is also left as it is.

Subsequently, as shown in FIGS. 21, 22(a), 22(b), and 22(c), the spacer material 245 is eliminated by anisotropic etching. In this etching process, if the exposed first mask material layer 215 is made of a material for which a desired selective etching ratio of etching on the spacer material 245 can be set, e.g., made of a silicon nitride film as the third mask material layer 225 is, the spacer material 245 remaining on the gap portions can be eliminated selectively without etching the third mask material layer 225 and first mask material layer 215. As a result, the core portions and the gap portions are formed into uniform structure each of which is a lamination of the third mask material layer 225 and the second mask material layer 220 and has the same mask thickness.

Following this, the second round of lithography and etching starts. In the second round of lithography and etching, as shown in FIGS. 23, 24(a), 24(b), and 24(c), a third organic film 232, a second silicon-containing film 237, and a second resist 242 are formed first in increasing order.

Subsequently, as shown in FIGS. 25, 26(a), 26(b), and 26(c), the second resist 242 is processed into a second resist pattern 242a, which is formed by, for example, patterning using an ArF immersion exposure system. The second resist pattern 242a includes patterns of linear openings extending in the Y direction and repeated in the X direction at given intervals. At the core portions (FIG. 26(a)) and the gap portions (FIG. 26(b)), the structure below the third mask material layer 225 is the same and therefore the same optical constant is obtained. As a result, in principle, optical deviation caused by intervals between the second resist patterns 242a on the core portions and the same on the gap portions can be avoided.

Subsequently, as shown in FIGS. 27, 28(a), 28(b), and 28(c), the second silicon-containing film 237 and third organic film 232 are etched anisotropically, using the second resist pattern 242a as an etching mask, to transfer the second resist pattern 242a to the second silicon-containing film 237 and third organic film 232. This etching is performed under a condition that allows adoption of a selective etching ratio for the third mask material layer 225, and creates openings 232a penetrating the second silicon-containing film 237 and third organic film 232. In the openings 232a, respective surfaces of the third mask material layer 225 and first mask material layer 215 having been concealed under the third organic film 232 until the etching are exposed.

Subsequently, as shown in FIGS. 29, 30(a), 30(b), and 30(c), the third mask material layer 225 and second mask material layer 220 are eliminated selectively by anisotropic etching using a pattern (third mask pattern) composed of the second silicon-containing film 237 and the third organic film 232 as an etching mask. This etching transfers the second resist pattern 242a to the third mask material layer 225 and second mask material layer 220. As a result, the space portions of line-and-space patterns in the X' direction and the space portions of line-and-space patterns in the Y direction are synthesized to form multiple island patterns.

Because the openings 232a include the exposed part of the first mask material layer 215, both first mask material layer 215 and third mask material layer 225 must be made of the same material, such as silicon nitride, and the first mask material layer 215 must be made thicker than the third mask material layer 225 so that the first mask material layer 215 remains as it is even when the third mask material layer 225 is etched.

Subsequently, as shown in FIGS. 31, 32(a), 32(b), and 32(c), the second silicon-containing film 237 and third organic film 232 are eliminated by plasma ashing. During this plasma ashing, the carbon film 210 covered with the first mask material layer 215 is protected from the ashing process and therefore remains as it is.

Subsequently, as shown in FIGS. 33, 34(a), 34(b), and 34(c), the first mask material layer 215 and the carbon film 210 are eliminated by anisotropic etching, using the second mask material layer 220 as an etching mask. By this etching, the third mask material layer 225 is also eliminated. As a result, the island patterns are transferred to the carbon film 210.

Subsequently, as shown in FIGS. 35, 36(a), 36(b), and 36(c), the field nitride film 205 and the pad dielectric film 200 are eliminated selectively by anisotropic etching, using the carbon film 210 as an etching mask, and then the semiconductor substrate 100 is eliminated selectively by anisotropic etching to form the isolation trenches 103.

Subsequently, as shown in FIGS. 37, 38(a), 38(b), and 38(c), the isolation trenches 103 are filled with the field oxide film 108 to form a pattern of field oxide film 108. Following this, other constituent elements are formed by a known method to complete the semiconductor device 1 of FIGS. 1 and 2.

Figure 39:
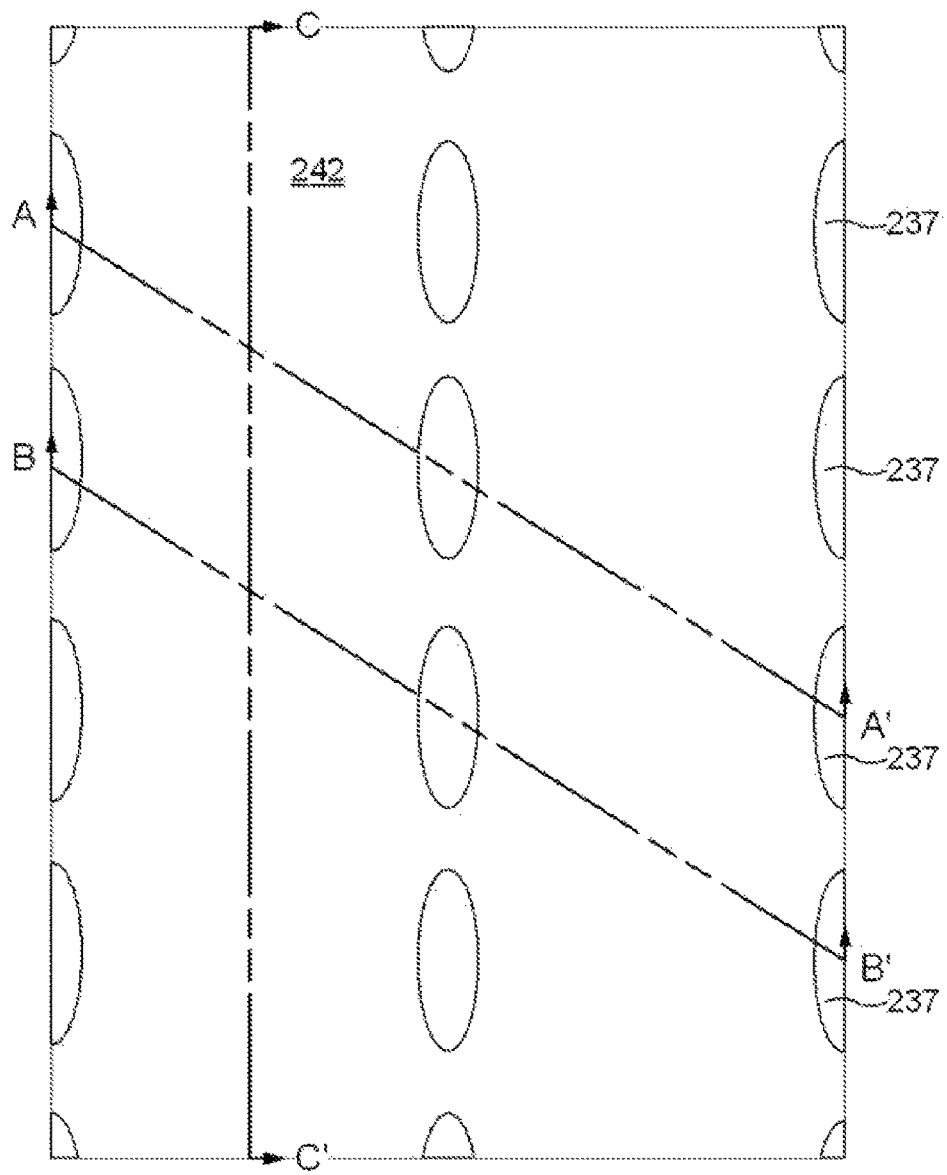
FIGS. 39 and 40 are plan views of a manufacturing method in accordance with another embodiment of the present invention.
Figure 40:
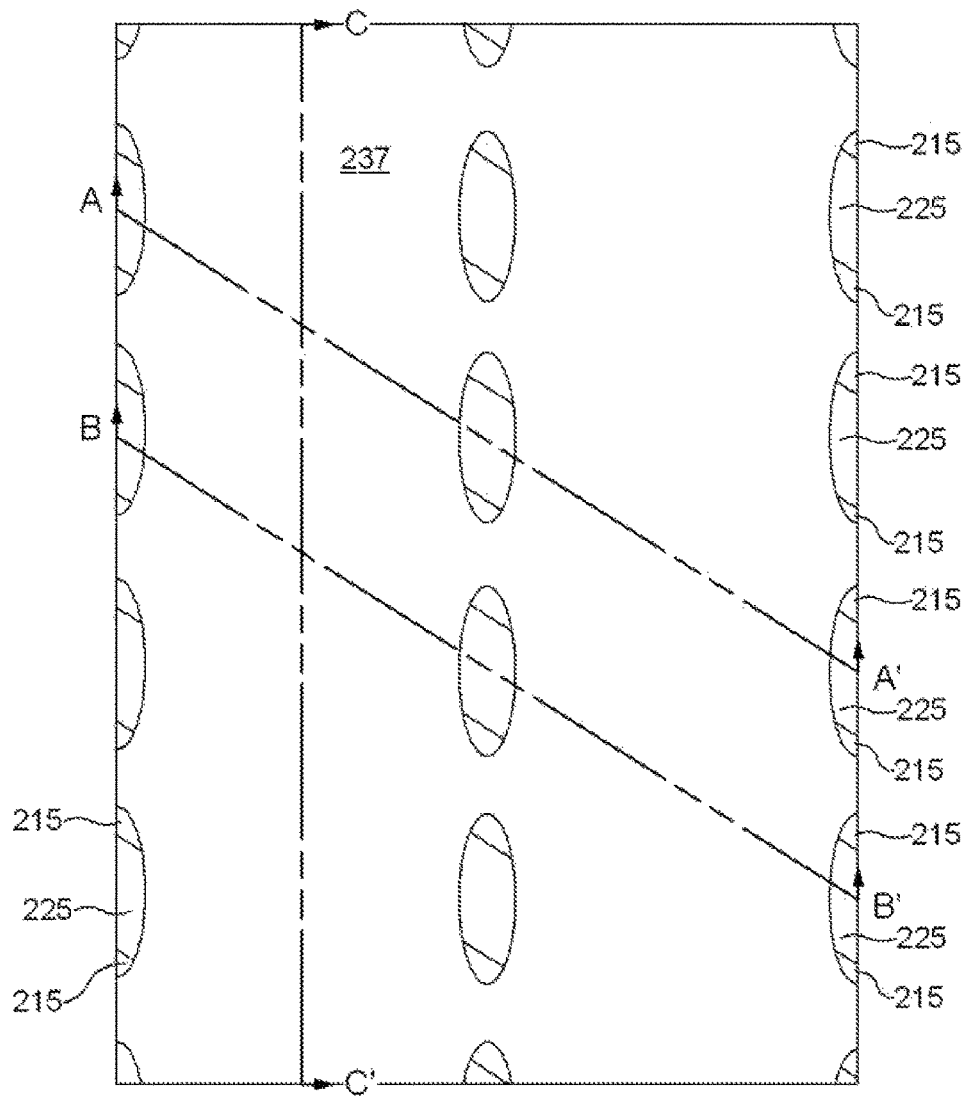

FIGS. 39 and 40 are diagrams for explaining a manufacturing method for a semiconductor device according to a different (another) embodiment of the present invention. Processes indicated in FIGS. 39 and 40 correspond to processes indicated in FIGS. 25 and 27 according to the above preferred embodiment, a cross-sectional view of FIG. 39 corresponds to the cross-sectional view of FIG. 26, and a cross-sectional view of FIG. 40 corresponds to the cross-sectional view of FIG. 28.

Figure 26:
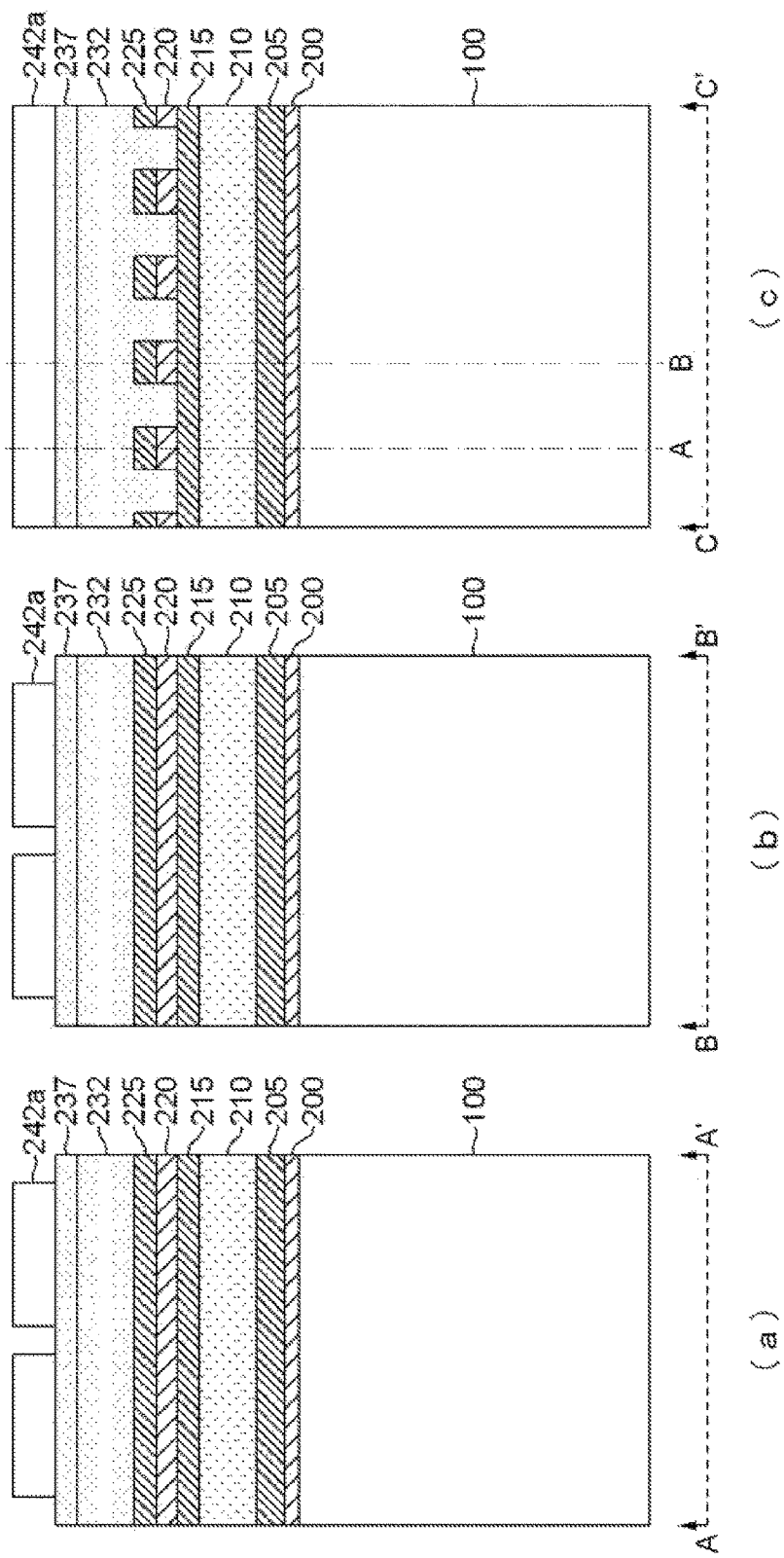
FIGS. 26 (a), (b), (c) are cross-sectional views of a manufacturing method in accordance with an embodiment along the line A-A', B-B', C-C' in FIG. 25, respectively.
Figure 27:
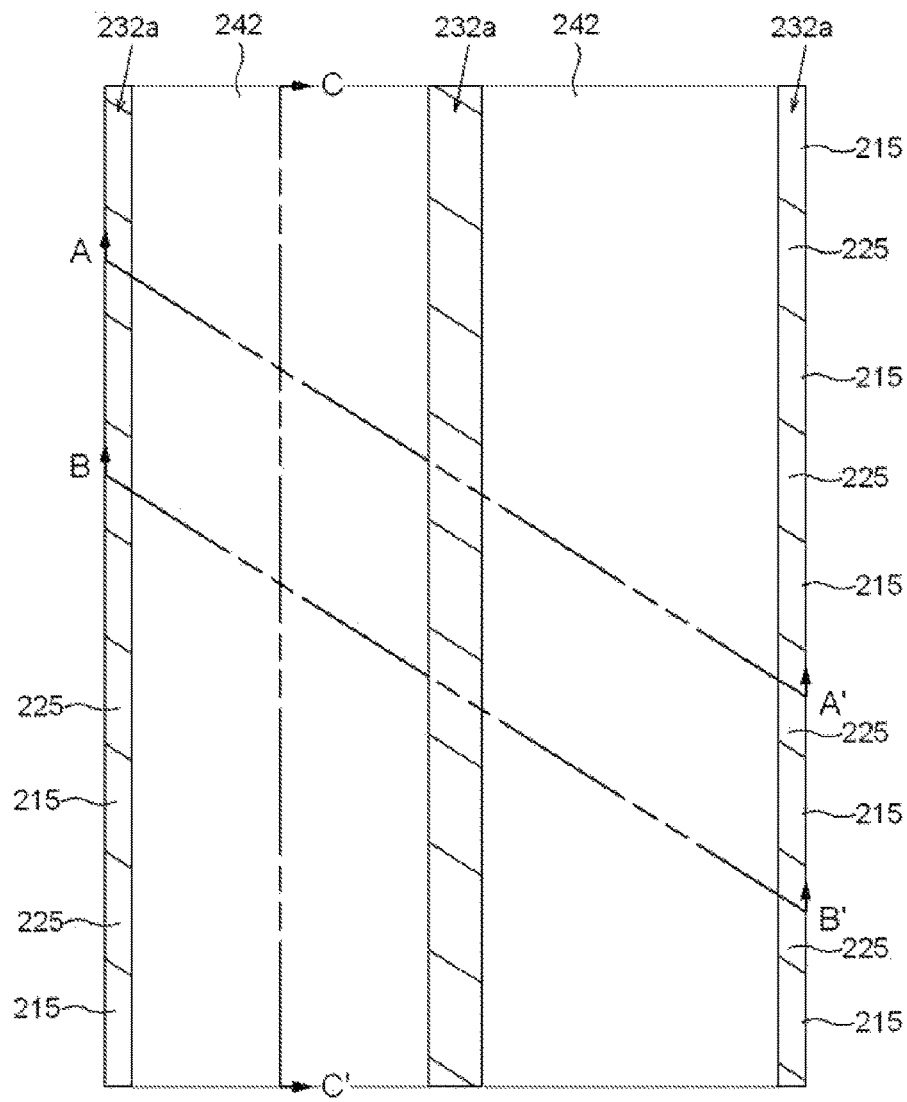
FIG. 27 is a plan view of a manufacturing method in accordance with an embodiment of the present invention.

Processes indicated in FIGS. 3 to 24 of the different embodiment are the same as the processes indicated in FIGS. 3 to 24 of the preferred embodiment. Following these processes, to form a second pattern, the second photoresist 242 is processed into the second resist pattern 242a. As shown in FIGS. 39 and 26, the second resist pattern 242a is formed by arranging patterns of openings each consisting of multiple holes lined up cyclically in the Y direction, at given intervals in the X direction. In other words, the openings of the second resist pattern 242a of the different embodiment are not continuous line patterns but are broken line patterns extending intermittently in the Y direction. The holes may be formed into an elliptic or rectangular shape.

Figure 28:
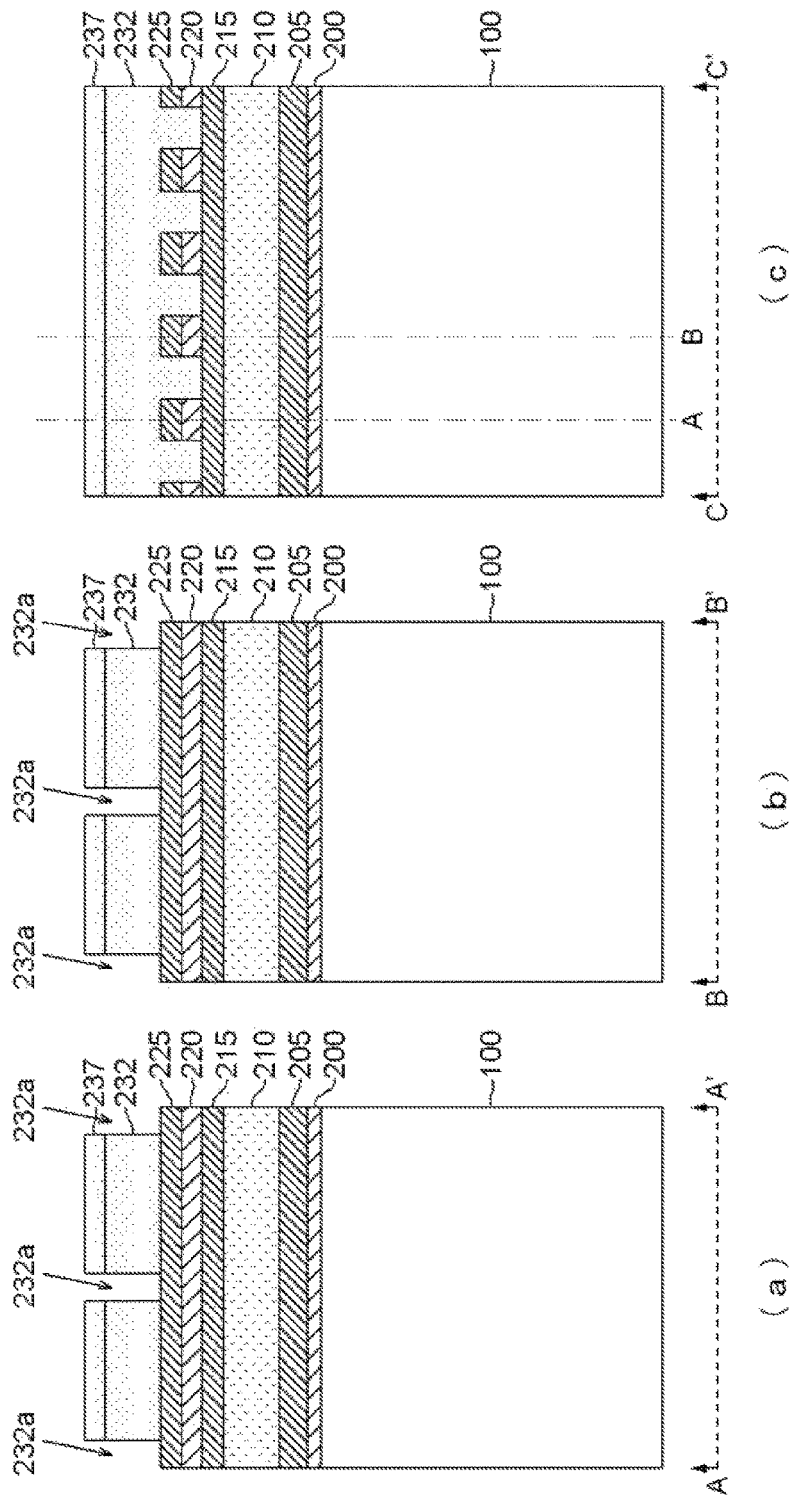
FIGS. 28 (a), (b), (c) are cross-sectional views of a manufacturing method in accordance with an embodiment along the line A-A', B-B', C-C' in FIG. 27, respectively.
Figure 29:
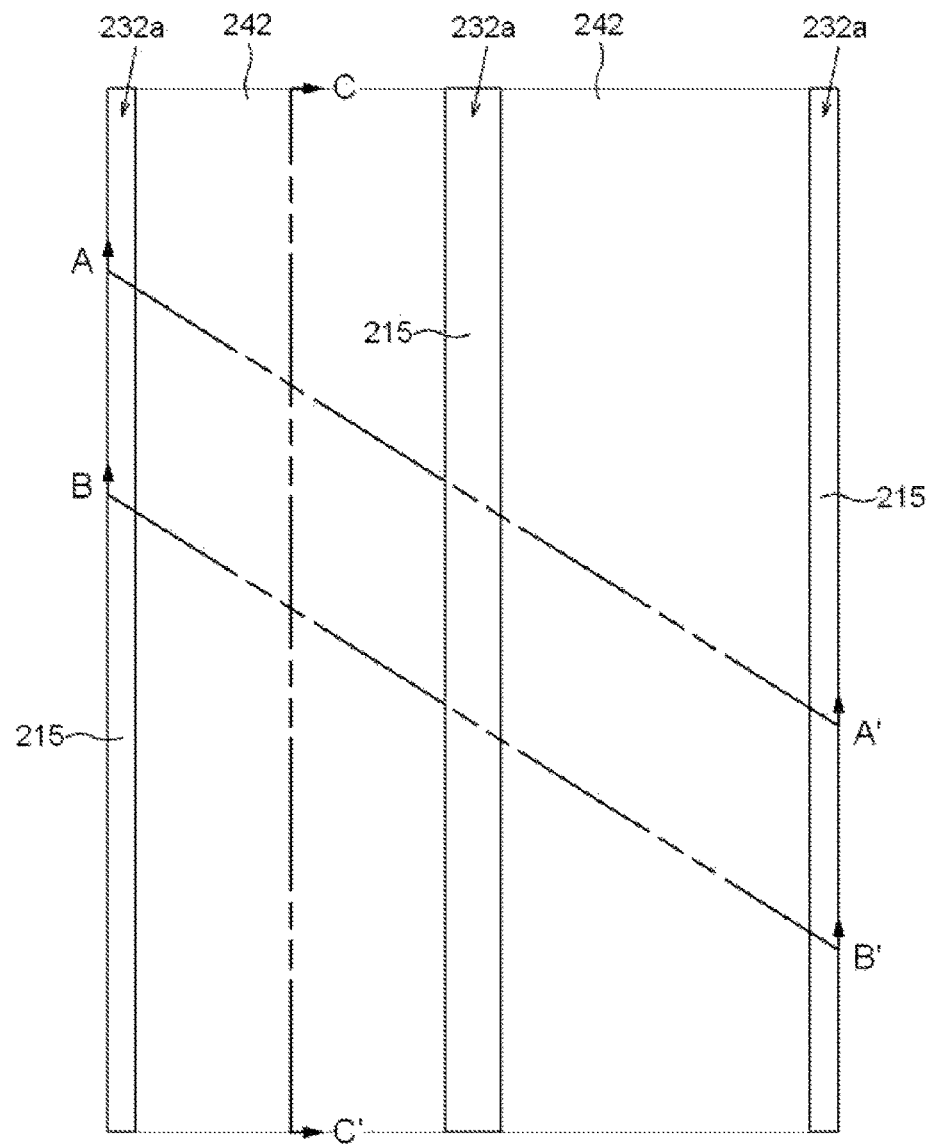
FIG. 29 is a plan view of a manufacturing method in accordance with an embodiment of the present invention.
Figure 30:
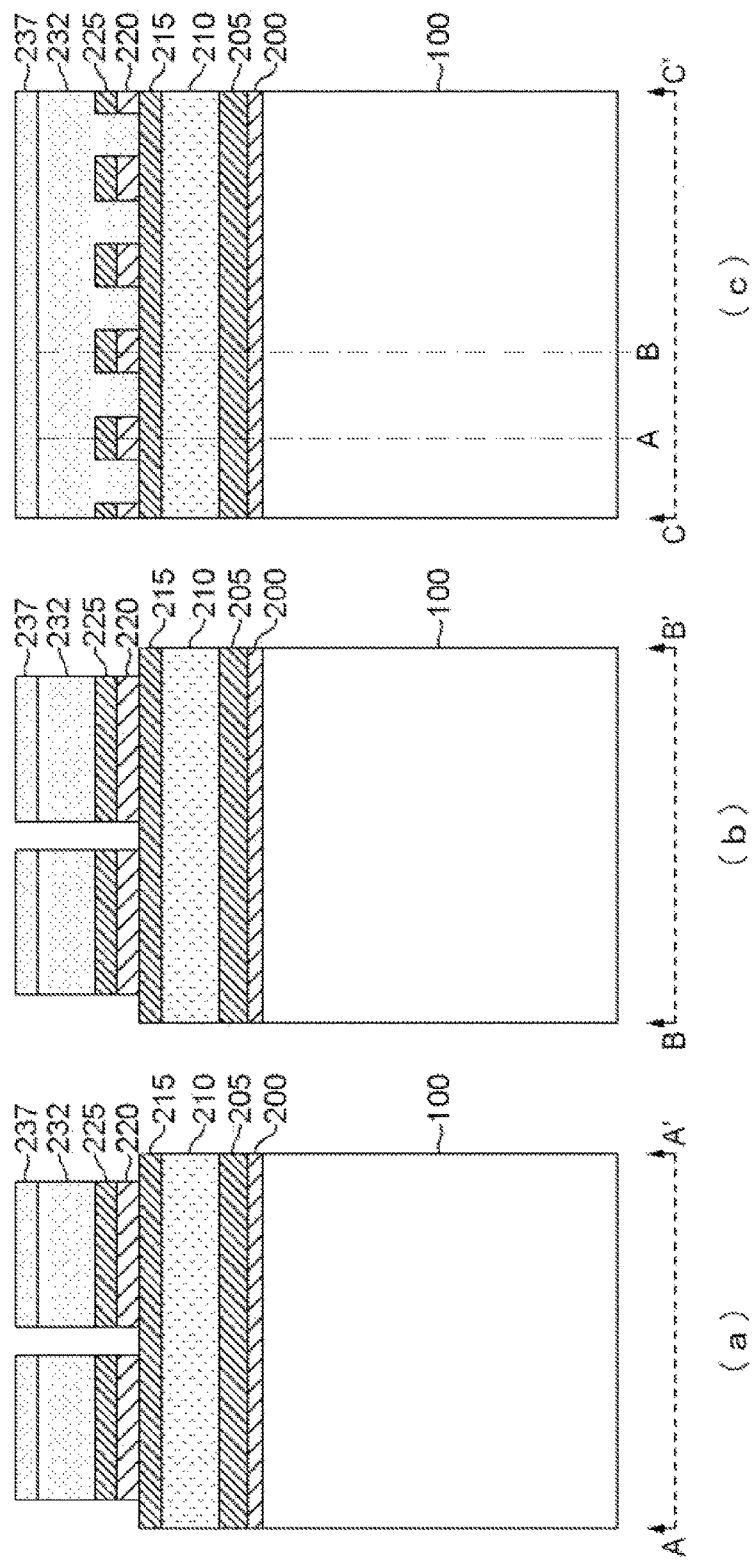
FIGS. 30 (a), (b), (c) are cross-sectional views of a manufacturing method in accordance with an embodiment along the line A-A', B-B', C-C' in FIG. 29, respectively.
Figure 31:
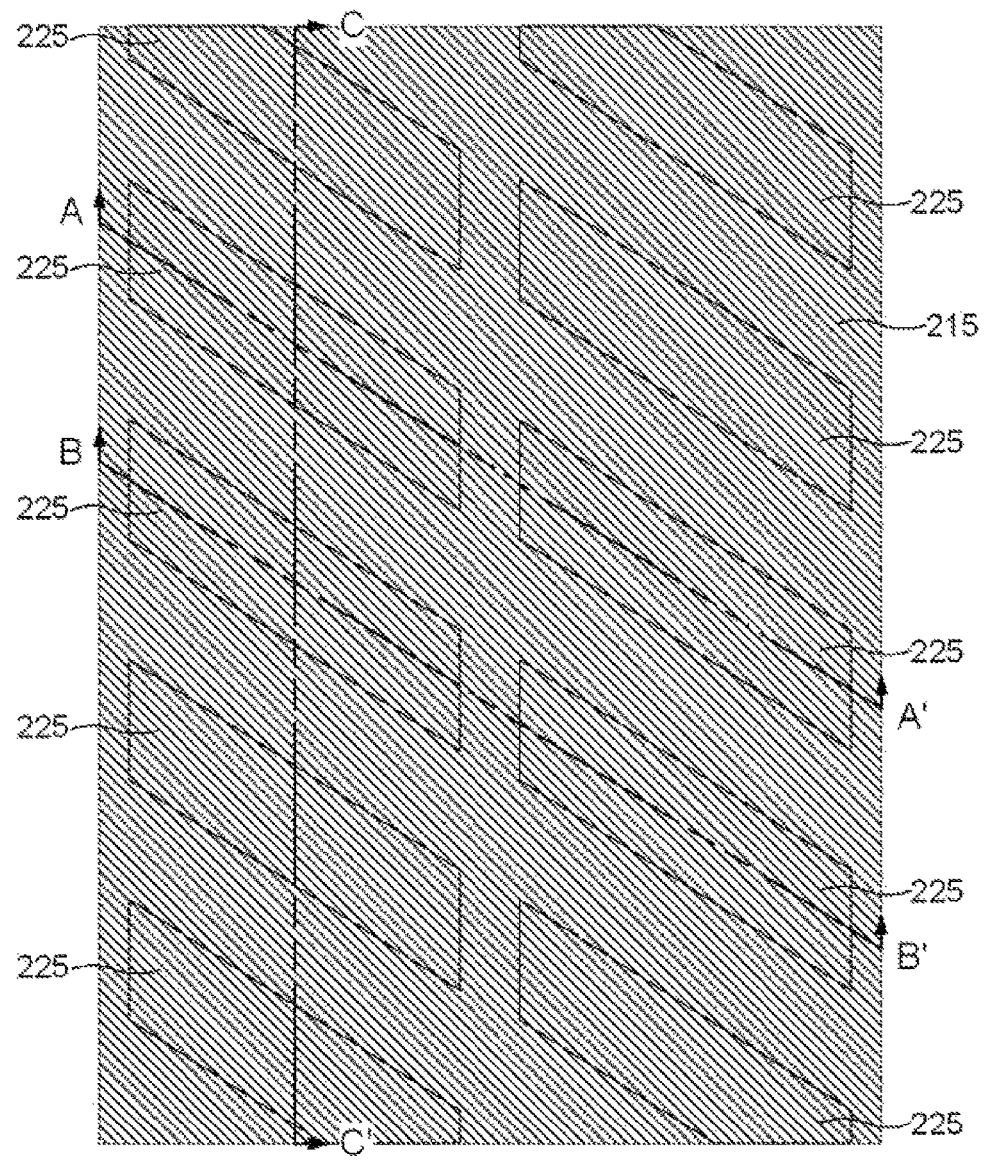
FIG. 31 is a plan view of a manufacturing method in accordance with an embodiment of the present invention.
Figure 32:
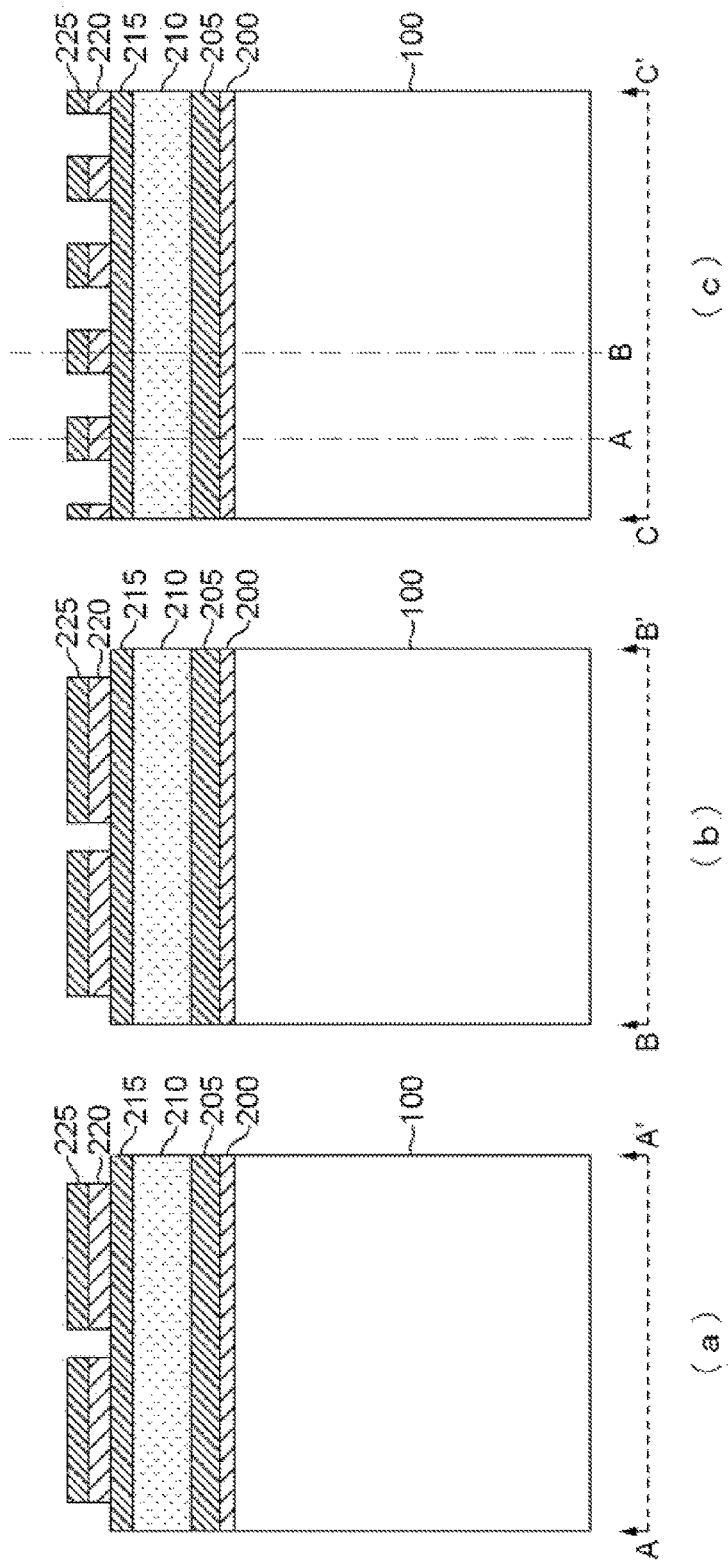
FIGS. 32 (a), (b), (c) are cross-sectional views of a manufacturing method in accordance with an embodiment along the line A-A', B-B', C-C' in FIG. 31, respectively.
Figure 33:
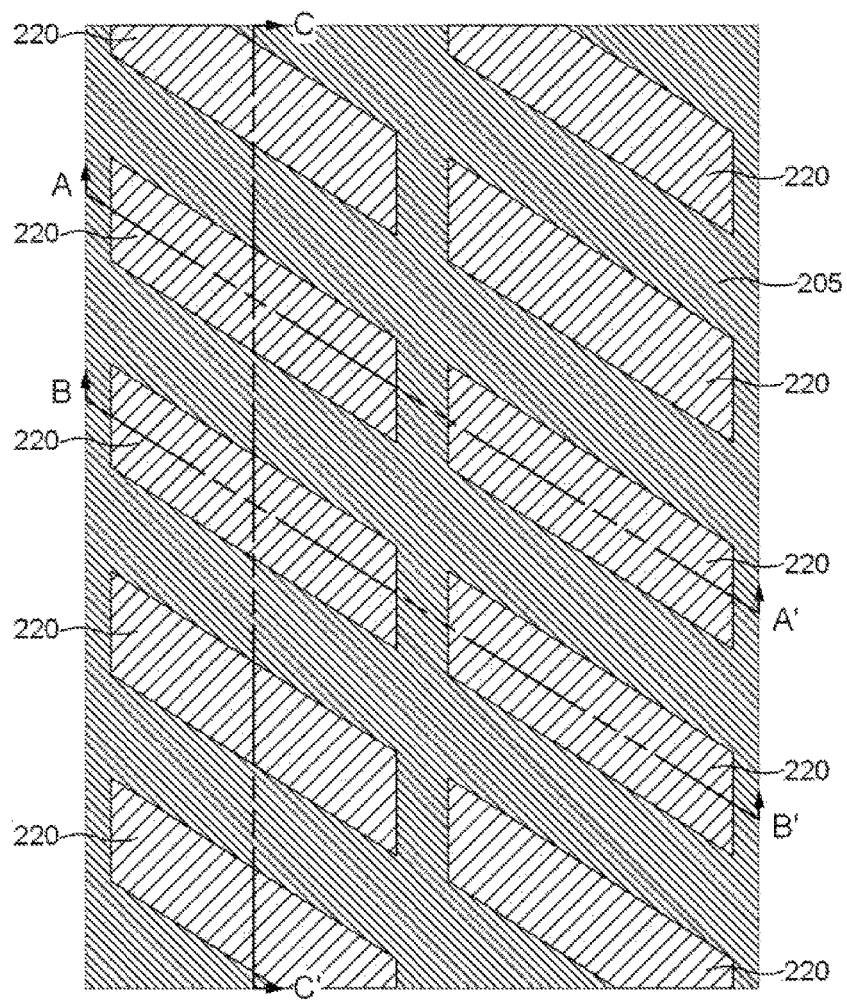
FIG. 33 is a plan view of a manufacturing method in accordance with an embodiment of the present invention.
Figure 34:
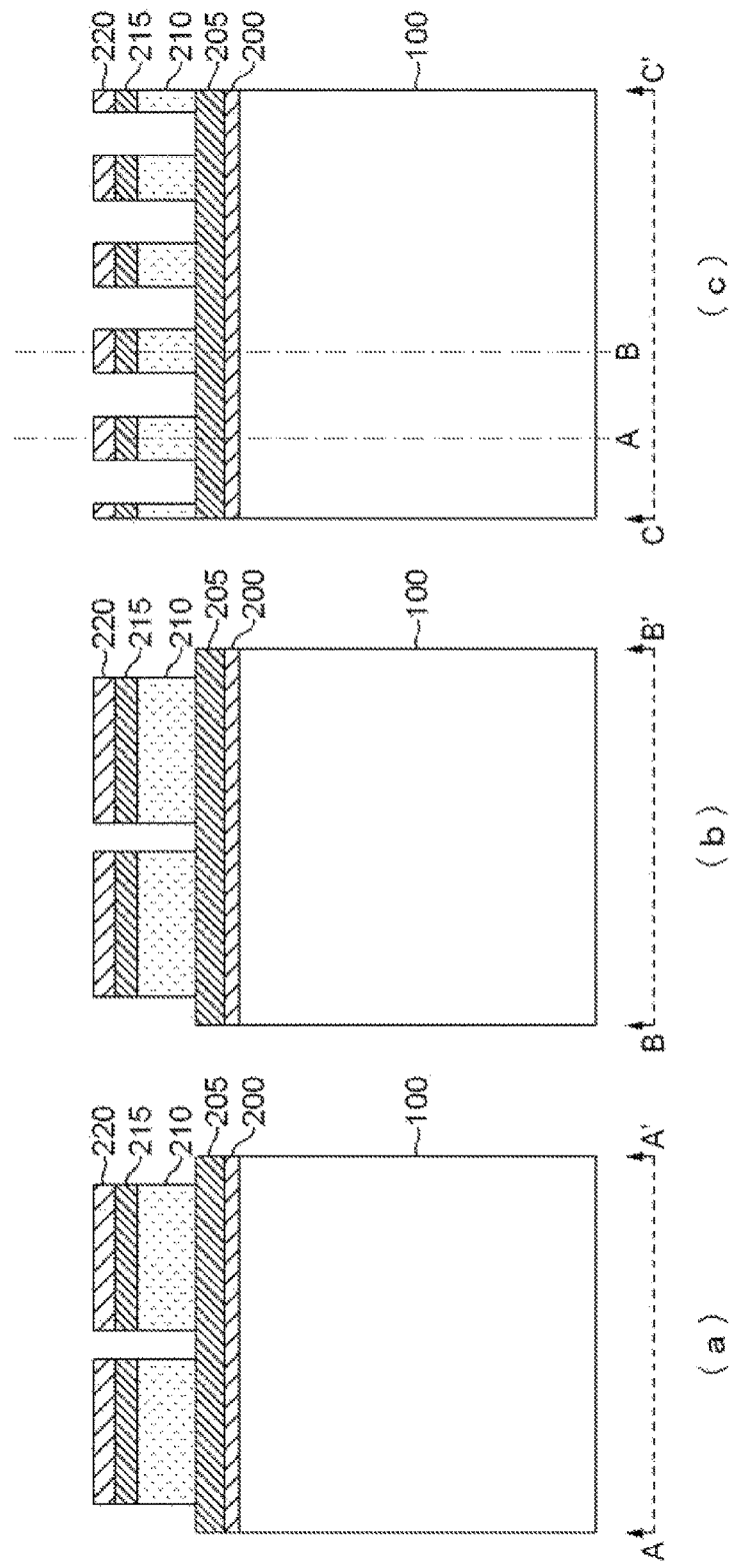
FIGS. 34 (a), (b), (c) are cross-sectional views of a manufacturing method in accordance with an embodiment along the line A-A', B-B', C-C' in FIG. 33, respectively.
Figure 35:
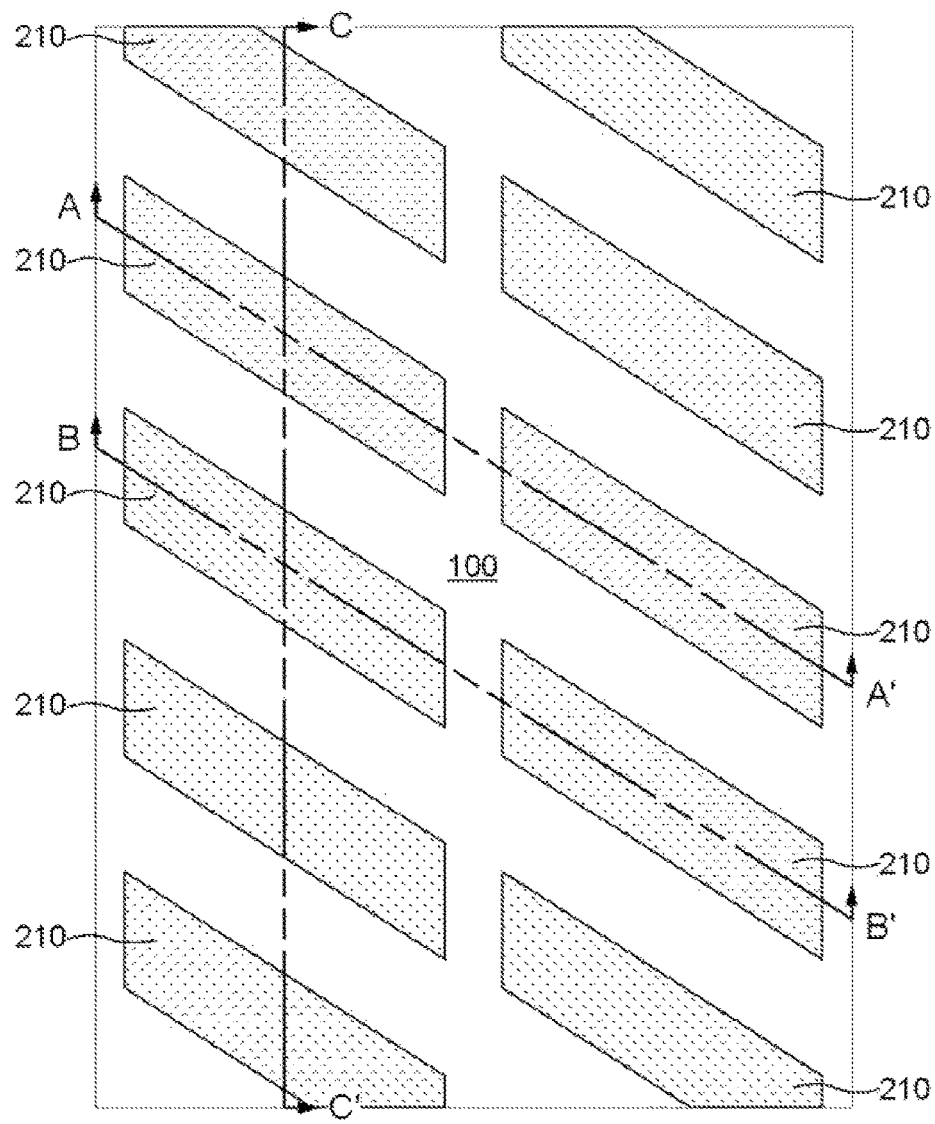
FIG. 35 is a plan view of a manufacturing method in accordance with an embodiment of the present invention.
Figure 36:
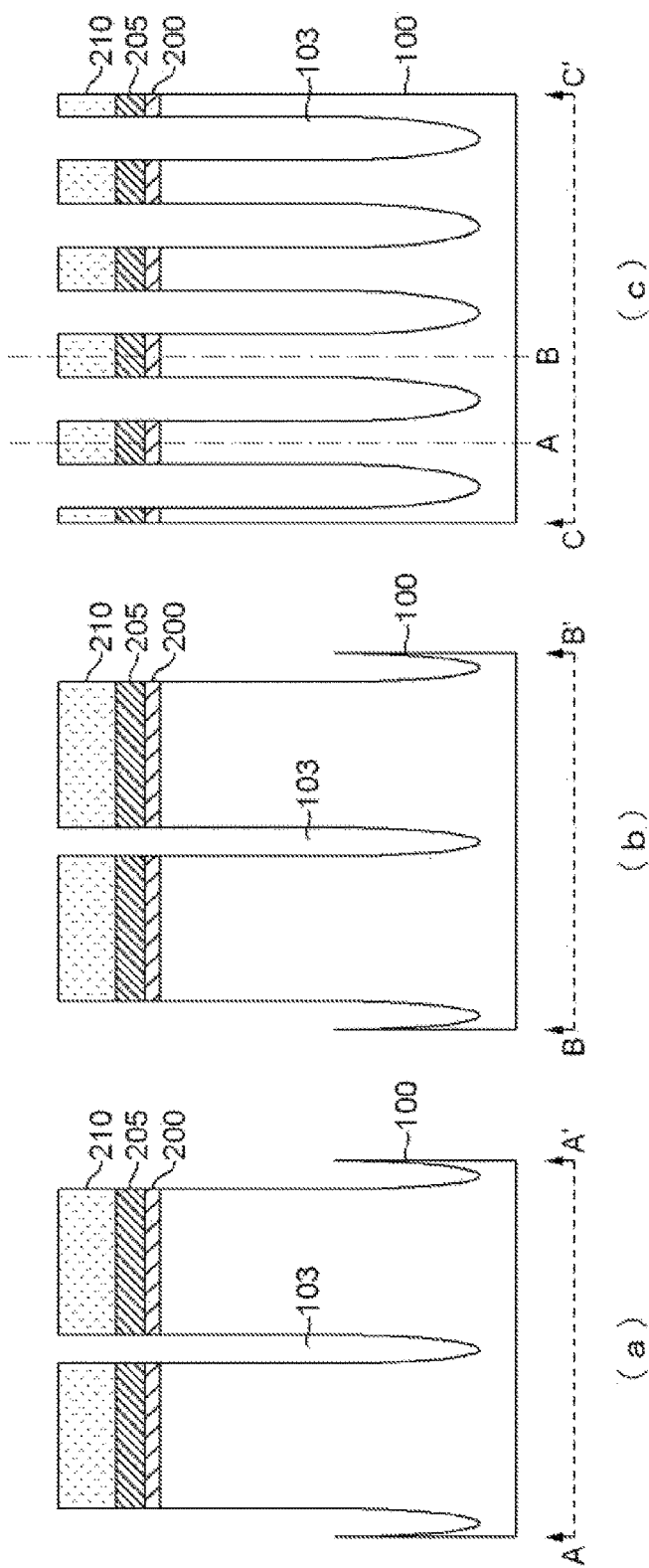
FIGS. 36 (a), (b), (c) are cross-sectional views of a manufacturing method in accordance with an embodiment along the line A-A', B-B', C-C' in FIG. 35, respectively.
Figure 37:
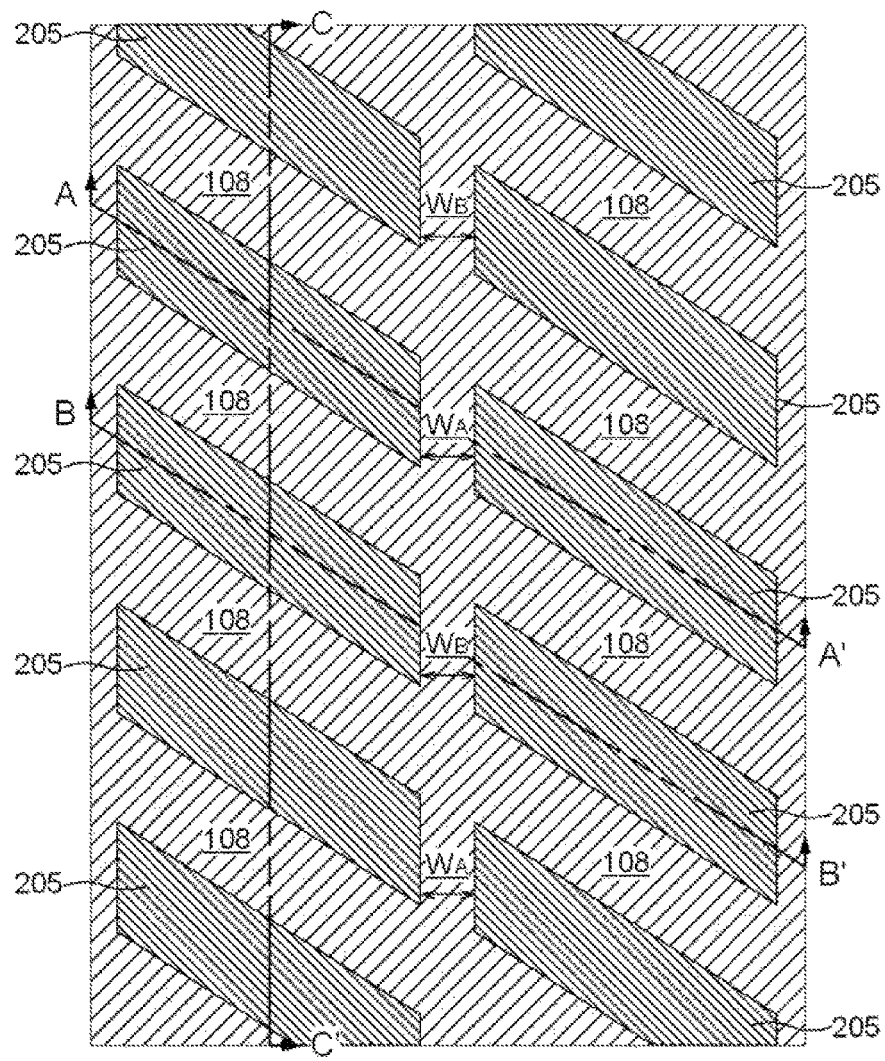
FIG. 37 is a plan view of a manufacturing method in accordance with an embodiment of the present invention.
Figure 38:
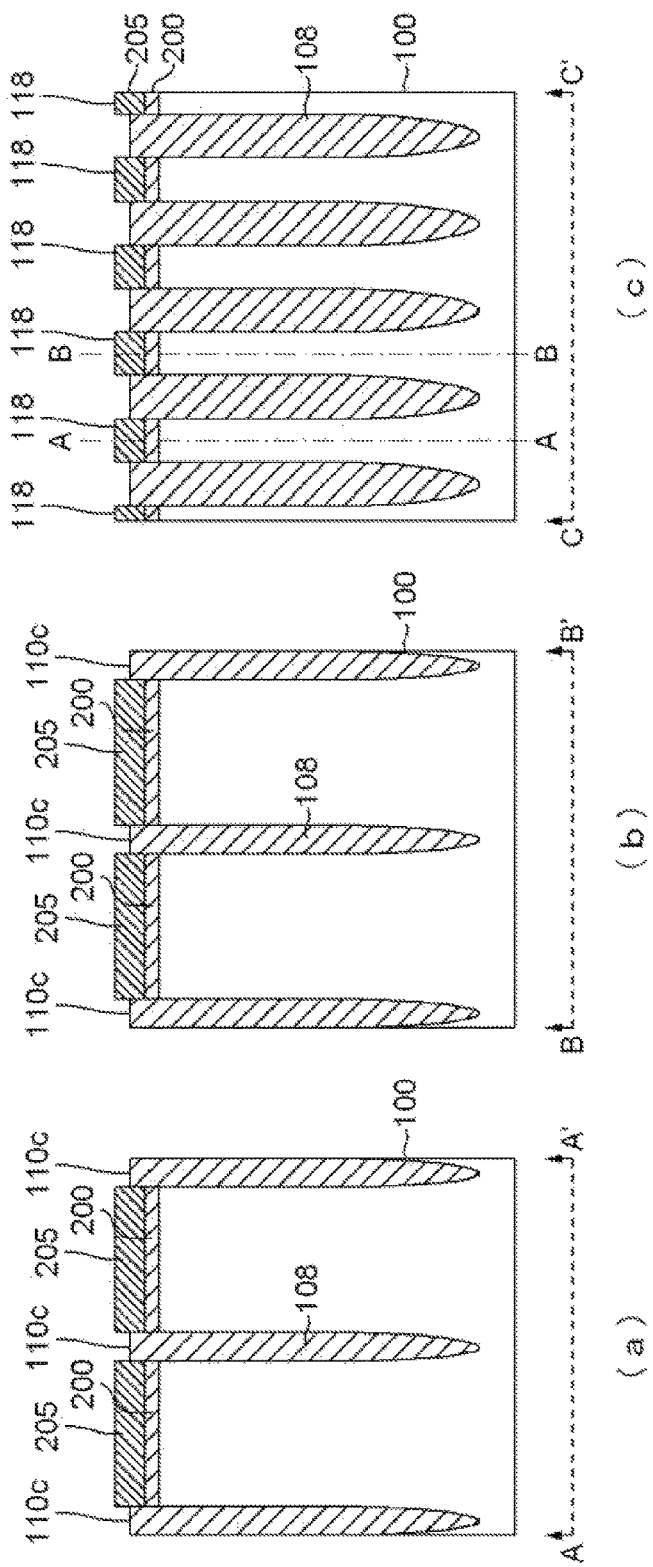
FIGS. 38 (a), (b), (c) are cross-sectional views of a manufacturing method in accordance with an embodiment along the line A-A', B-B', C-C' in FIG. 37, respectively.

Subsequently, as shown in FIGS. 40 and 28, the second silicon-containing film 237 and third organic film 232 are etched, using the second resist pattern 242a as a mask, to transfer the layout pattern of the second resist pattern 242a to the second silicon-containing film 237 and third organic film 232. By this etching, openings penetrating the second silicon-containing film 237 and third organic film 232 are formed under the openings of the second resist pattern 242a. As a result, in these openings, the surface of the third mask material layer 225 or surface of the first mask material layer 215 is exposed. Processes to follow this process are the same as the processes according to the preferred embodiment.

According to the different embodiment, the third mask material layer 225 is formed on the second mask material layer 220, as is in the preferred embodiment. In the same manner as in the preferred embodiment of the present invention, therefore, portions along two-dot broken lines A-A' and portions along two-dot broken lines B-B' shown in FIG. 40 are formed into uniform structures each of which is a lamination of the third mask material layer 225 and the second mask material layer 220 and has the same mask thickness.

Preferred embodiments of the present invention have been described above. The present invention is not limited to the above embodiment but may be modified into various forms of applications on the condition that the modification does not deviate from the substance of the present invention. Obviously, the modified forms of applications are also included in the scope of the invention.

For example, according to the above embodiments, the present invention is applied as a processing method for forming the isolation regions that define the multiple active areas on the semiconductor substrate. The present invention, however, is applied not only to the formation of isolation regions but also to various processes.

CONCLUSION

The disclosure provides a manufacturing method of a semiconductor device that includes forming first and second layers over an underlying martial such that the first layer is between the underlying material and the second layer, forming a third layer over the second layer, forming first and second core portions apart from each other over the third layer, forming a gap portion between the first and the second core portions; and removing the second and the third layers by using the first and the second core portions and the gap portion as a mask to expose a part of the first layer.

The disclosure further provides a manufacturing method of a semiconductor device that includes forming first and second layers over an underlying martial such that the first layer is between the underlying material and the second layer, forming a third layer over the second layer, forming first and second features respective including side surfaces facing each other over the third layer, forming a sacrifice film that covers the respective side surfaces of the first and the second features so as to form a concave portion therebetween over the third layer, forming a third feature in the concave portion of the sacrifice film, removing the sacrifice film between the third feature and each of the first and the second features to expose the third layer; and removing the second and the third layers in a region of the exposed part of the third layer to expose a first part of the first layer.

The disclosure still further provides a manufacturing method of a semiconductor device that includes forming first and second layers over an underlying martial such that the first layer is between the underlying material and the second layer, forming a third layer over the second layer, coating a first triple-layer including a first organic material over the third layer, forming first and second features each including the organic material by patterning the first triple-layer to expose a part of the third layer, forming a spacer covering the exposed part of the third layer and respective sidewall portions of the first and the second features so as to form a concave portion between the first and the second features, coating a second organic material on the spacer, removing a part of the second organic material so as to remain the second organic material in the concave portion of the spacer as a third feature, removing selectively each sidewall portion of the spacer between the third feature and each of the first and the second features to expose a first part of the third layer, removing the second and the third layers in the first part of the third layer to expose a part of the first layer, removing the first and the second features to expose a second part of the third layer and the third feature to expose a residual spacer, removing the residual spacer, coating a second triple-layer, forming a fourth feature including an opening intersecting the second part of the third layer and the exposed part of the first layer by patterning the second triple-layer, removing selectively the second and the third layers in the opening of the fourth feature to expose another part of the first layer, removing the fourth feature, removing the exposed part of the first layer and the another exposed part of the first layer with a residual third layer; and etching the underlying material by using the second layers as a mask.

What is claimed is:

1. A method comprising:
   forming a hard-mask layer over a semiconductor substrate;
   patterning the hard-mask layer to form a patterned hard-mask; and
   selectively removing the semiconductor substrate by using the patterned hard-mask as an etching mask;
   wherein the patterning the hard-mask layer comprises:
   forming a first layer over the hard-mask layer;
   forming a second layer over the first layer;
   forming a third layer over the second layer;
   forming a plurality of patterns over the third layer apart from each other;
   transferring the plurality of patterns to the third and second layers so that the third layer is converted into a patterned third layer and the second layer is converted into a patterned second layer;
   further converting the patterned second layer into a further patterned second layer so that the further patterned second layer is different in pattern from the patterned second layer; and
   transferring the further patterned second layer to the first layer and the hard-mask layer to form the patterned hard-mask.

2. The method of claim 1, wherein the hard-mask layer comprises carbon.

3. The method of claim 1, further comprising, before forming the hard-mask layer, forming a pad dielectric film over the substrate.

4. The method of claim 3, further comprising, before forming the hard-mask layer, forming a field dielectric film over the pad dielectric material.

5. The method of claim 1, wherein the further converting the patterned second layer into the further patterned second layer comprises:
   covering the patterned second layer with a fourth layer;
   patterning the fourth layer to from a patterned fourth layer; and
   transferring the patterned fourth layer to the patterned second layer to form the further patterned second layer.

6. The method of claim 5, wherein the patterned second layer is covered with the fourth layer while the patterned third layer is intervening between the patterned second layer and the fourth layer so that the patterned fourth layer is further transferred to the patterned third layer.

7. The method of claim 1, wherein the forming the plurality of patterns comprises:
   forming first and second core portions; and
   forming a gap portion between the first and second core portions.

8. The method of claim 7, wherein the forming the gap portion comprises:
   forming a sacrificial layer over the first and second core portions to form a concave portion between the first and second core portions;
   filling the concave portion with dielectric material; and
   removing respective portions of the sacrificial layer between the first core portion and the dielectric material and between the second core portion and the dielectric material to expose corresponding portions of the third layer.

9. The method of claim 1, wherein the selectively removing the semiconductor substrate causes to form a plurality of trenches into the semiconductor substrate.

10. The method of claim 9, further comprising filling the plurality of tranches with dielectric material to form a plurality of active regions defined by the plurality of tranches.

11. The method of claim 10, further comprising:
forming a plurality of buried word lines into the semiconductor substrate, each of the plurality of buried word lines crossing associated one or ones of the plurality of active regions; and
forming a plurality of access transistors into the plurality of active regions, respectively, each of the access transistors comprising a first diffusion region, a second diffusion region and a channel region along an associated one of the buried word lines between the first and second diffusion regions.

12. The method of claim 11, further comprising forming a plurality of capacitors each in electrical contact with the first diffusion region of an associated one of the plurality of access transistors.

13. A structure made by the method of claim 1.

* * * * *

UNITED STATES PATENT AND TRADEMARK OFFICE
CERTIFICATE OF CORRECTION

PATENT NO. : 10,438,809 B2
APPLICATION NO. : 15/652768
DATED : July 18, 2017
INVENTOR(S) : Lionel Lupo Page 1 of 1

It is certified that error appears in the above-identified patent and that said Letters Patent is hereby corrected as shown below:

On the Title Page

(57) Abstract: 2nd column, 29th line – Replace "over an underlying martial such that the first layer is between" with --over an underlying material such that the first layer is between--

In the Claims

Column 12, Line 46 – Replace "to from a" with --to form a--

Column 13, Line 8 – Replace "of tranches with" with --of trenches with--

Signed and Sealed this
Twenty-fourth Day of December, 2019

Andrei Iancu
*Director of the United States Patent and Trademark Office*